United States Patent
Hiyama et al.

(10) Patent No.: US 8,987,711 B2
(45) Date of Patent: Mar. 24, 2015

(54) ORGANIC ELECTROLUMINESCENCE ELEMENT, METHOD FOR PRODUCING ORGANIC ELECTROLUMINESCENCE ELEMENT, AND ILLUMINATION DEVICE USING ORGANIC ELECTROLUMINESCENCE ELEMENT

(75) Inventors: Kunimasa Hiyama, Hachioji (JP); Toshiya Kondo, Hino (JP); Takeshi Ono, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 404 days.

(21) Appl. No.: 13/510,077

(22) PCT Filed: Nov. 18, 2010

(86) PCT No.: PCT/JP2010/070550
§ 371 (c)(1),
(2), (4) Date: May 16, 2012

(87) PCT Pub. No.: WO2011/062215
PCT Pub. Date: May 26, 2011

(65) Prior Publication Data
US 2012/0228601 A1    Sep. 13, 2012

Related U.S. Application Data

(66) Substitute for application No. PCT/JP2010/070550, filed on Nov. 18, 2010.

(30) Foreign Application Priority Data

Nov. 19, 2009   (JP) ................................ 2009-263645

(51) Int. Cl.
   *H01L 51/52*    (2006.01)
   *H01L 33/34*    (2010.01)
   (Continued)

(52) U.S. Cl.
   CPC .......... *H01L 51/5275* (2013.01); *G02B 5/0231* (2013.01); *H01L 51/5253* (2013.01)
   USPC .................. 257/40; 257/98; 438/26; 438/28; 438/99

(58) Field of Classification Search
   USPC ............................. 257/40, 98; 438/26, 28, 99
   See application file for complete search history.

(56) References Cited

U.S. PATENT DOCUMENTS 4,774,435 A    9/1988   Levinson
6,329,041 B1 *  12/2001   Tsuchiya et al. ........... 428/195.1
(Continued)

FOREIGN PATENT DOCUMENTS

JP    62-172691 U    11/1987
JP    11-283751 A    10/1999
(Continued)

OTHER PUBLICATIONS

International Search Report for International Application No. PCT/JP2010/070550, mailed Feb. 22, 2011, with English translation.

*Primary Examiner* — Evan Pert
(74) *Attorney, Agent, or Firm* — Cantor Colburn LLP

(57) ABSTRACT

Provided is an organic electroluminescence element containing a light transmissive base material laminated thereon a transparent electrode, a light emitting layer and a counter electrode in this order, wherein the light transmissive base material contains a light transmissive resin substrate (resin substrate B) provided with a hard coat layer on both surfaces of the light transmissive resin substrate, the hard coat layers containing metal oxide nano particles; and the transparent electrode is formed on one hard coat layer (H1); and a rugged structure is formed on one surface of the other hard coat layer (H2), the one surface being opposite to another surface of the other hard coat layer (H2) which is contacted with the light transmissive resin substrate (resin substrate B).

13 Claims, 7 Drawing Sheets

(51) Int. Cl.
*H01L 33/48* (2010.01)
*G02B 5/02* (2006.01)

(56) References Cited

U.S. PATENT DOCUMENTS

| | | | | |
|---|---|---|---|---|
| 6,562,440 | B1 * | 5/2003 | Tsuchiya et al. | 428/195.1 |
| 6,583,935 | B1 * | 6/2003 | Saif et al. | 359/582 |
| 6,777,070 | B1 * | 8/2004 | Murata et al. | 428/323 |
| 7,141,298 | B2 * | 11/2006 | Shoshi et al. | 428/331 |
| 7,378,136 | B2 * | 5/2008 | Pokorny et al. | 428/1.3 |
| 7,569,269 | B2 * | 8/2009 | Takada et al. | 428/323 |
| 7,833,607 | B2 * | 11/2010 | Kawano et al. | 428/143 |
| 8,512,801 | B2 * | 8/2013 | Yoshihara et al. | 427/164 |
| 8,686,630 | B2 * | 4/2014 | Hiyama et al. | 313/504 |
| 2013/0141652 | A1 * | 6/2013 | Kuromizu | 348/790 |

FOREIGN PATENT DOCUMENTS

| | | |
|---|---|---|
| JP | 2001-202827 A | 7/2001 |
| JP | 2004-4175 A | 1/2004 |
| JP | 2004-4176 A | 1/2004 |
| JP | 2004-309932 A | 11/2004 |
| JP | 2005-71901 A | 3/2005 |
| JP | 2007-213824 A | 8/2007 |
| JP | 2008-207401 A | 9/2008 |
| JP | 2009-259792 A | 11/2009 |

\* cited by examiner

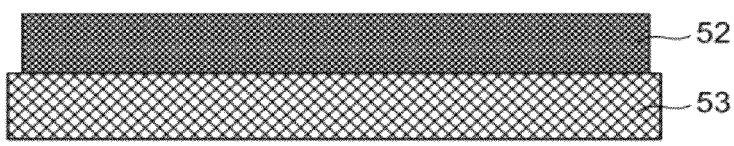

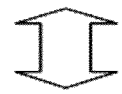
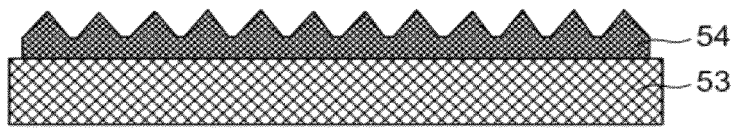

ORGANIC ELECTROLUMINESCENCE ELEMENT, METHOD FOR PRODUCING ORGANIC ELECTROLUMINESCENCE ELEMENT, AND ILLUMINATION DEVICE USING ORGANIC ELECTROLUMINESCENCE ELEMENT

CROSS REFERENCE TO RELATED APPLICATIONS

This is a U.S. national stage of application No. PCT/JP2010/070550, filed on 18 Nov. 2010. Priority under 35 U.S.C. §119(a) and 35 U.S.C. §365(b) is claimed from Japanese Application No. 2009-263645, filed 19 Nov. 2009, the disclosure of which are also incorporated herein by reference.

TECHNICAL FIELD

The present invention relates to an organic electroluminescence element, a method for producing an organic electroluminescence element and an illumination using this organic electroluminescence element.

BACKGROUND ART

Conventionally, an emission type electronic display device includes an electroluminescence display (hereinafter, referred to as an ELD) A constituent element of an ELD includes such as an inorganic electroluminescence element (hereinafter, referred to as an inorganic EL element) and an organic electroluminescence element (hereinafter, referred to as an organic EL element). An inorganic EL element has been utilized as a flat light source, however, it requires a high voltage of alternating current to operate an emission element.

On the other hand, an organic electroluminescence element is an element provided with a constitution comprising an emitting layer containing a emitting substance being sandwiched with a cathode and an anode, and an exciton is generated by an electron and a hole being injected into the emitting layer to be recombined, resulting emission utilizing light release (fluorescence and phosphorescence) at the time of deactivation of said exciton; the emission is possible at a voltage of approximately a few to a few tens volts, and an organic electroluminescence element is attracting attention with respect to such as superior viewing angle and high visual recognition due to a self-emission type as well as space saving and portability due to a completely solid element of a thin layer type.

Further, the major feature of the organic electroluminescence elements is also in the form of a surface light source of thin film differing from conventionally employed main light sources such as a light emitting diode or a cold-cathode tube. Possible applications, which can effectively utilize the above characteristic, include light sources for lighting and backlights of various displays and a light source for illumination. In particular, it has been attracted attention to employ them as a light source for illumination in recent years.

In the past, a glass has been used from the viewpoints of high thermal stability, high transparency, and low water vapor permeability as a substrate for such an element. However, the glass has features of easily broken and relatively heavy by nature, and in order to use for various applications, it has been required a light weight substrate which is h flexible and hardly broken. Consequently, use of a transparent plastic substrate has come to attract attention. However, during production, transport and keeping of an element, a plastic substrate is easily given a graze or a scratch on its surface by various external forces. As a result, it may not only spoil the external appearance, but it may produce problems such as nonuniform luminescence in the light emitting surface of the light emitting element and change of luminescence properties, and production of a crack originated from these scratches at the time of bending.

Moreover, when a light emitting element is composed, it is common practice to arrange a transparent electrode on a plastic plate to. Though, it may occur a crack on an electrode portion starting from the part bent from the flexible nature, or it may produce peeling of an electrode layer arises for the thermal shrinkage which is the characteristics of a plastic, and there is a problem of causing a leak and a short circuit of an element.

On the other hand, as a problem which should be solved for improving the performance of an organic electroluminescence element, there has been a problem for a long time that taking out efficiency of the light (the ratio of the energy of the taking out light from the substrate to the energy of the emitting light) was low. That is, since there is no directivity in luminescence of a light emission layer and the luminescence dissipates in all directions, there is a problem that the loss at the time of leading a light to front direction from the light emission layer is large, light intensity is insufficient, and a display screen becomes dark.

With regard to the luminescence from a light emission layer, only the luminescence coming out forward is used. The taking out efficiency of the light from the front can be approximated as "$1/2n^2$" according to the multiple reflections based on the classic optical theory. It will be mostly determined be the refractive index "n" of a light emitting layer. If the refractive index "n" of a light emitting layer is set to be about 1.7, the luminescence efficiency from the above-mentioned organic EL part will become simply about 20%. The remaining lights will spread to the surface direction of the light emitting layer (disappearance to the lateral direction) or will disappear on the metal electrode facing transparent electrode sandwiching the light emitting layer (absorption to the back direction)

To put it in other wards, the usual organic electroluminescence element will emit light inside the layer whose refractive index is higher than air (a refractive index is 1.7 to about 2.1), and can take out only about 15% to 20% of the lights generated in the light emitting layer of light. This caused the followings. The light which enters into an interface (interface between a transparent substrate and air) with the angle beyond a critical angle θ will cause total reflection and cannot take out the light outside the element. The light caused total reflection between the transparent electrode or the light emitting layer and the transparent substrate, and the light was wave-guided through the transparent electrode or the light emitting layer, and as a result, the light escaped in the surface direction of the element part, and there occurred loss of the light.

It is known the technology of providing with the hard coat layer made of a curable resin on the surface of a plastic substrate to improve a scratch proof nature of a plastic substrate surface. For example, in Patent document 1, there is disclosed a technology to provide with a hard coat layer made of a photo- or thermo-curable resin on at least one surface of a polycarbonate substrate.

As a means to prevent the appearance of crack in the electrode layer or the peeling from the substrate by improving the close adhesion of the substrate with the electrode, there is disclosed a technology, for example, in Patent document 2, to form an interlayer having an inorganic compound film and a graft polymer layer combined therewith on the uppermost surface of the substrate.

However, when these technologies are performed, it will be accompanied with increase of the cost due to the fact that the manufacturing process becomes complicated. In addition, fine adjustment of the technical constituent elements is required and it is requested an improved means which is easily carried out and by which adhesion with a substrate is more improved.

Various methods are examined as an approach of improving an efficiency of taking out of lights. For example, in Patent document 3, there is reported a method which forms ruggedness on a surface of a transparent substrate for preventing the total reflection at the interface between a transparent substrate and air from occurring. In Patent document 4, there is reported a method which introduces a flat layer between a substrate and a light emitting body, the refractive index of the flat layer being adjusted to be intermediate value of the substrate and the light emitting body, to form an anti-reflection film. Furthermore, in Patent document 5, there is reported a method of introducing a flat layer between a glass substrate and a light emitting body, the flat layer having a smaller refractive index than the glass substrate. In Patent document 6, there is reported a method of forming a diffraction grating at any one of places between a glass substrate, a transparent electrode layer, and a light emitting layer (including between the glass substrate and the external environments).

However, in the method of forming ruggedness on the surface of the transparent substrate or in the composition of forming a diffraction grating, although it is common to use the method of preparing ruggedness by etching with the photo lithography as a means to form ruggedness, this way has low manufacturing efficiency and it becomes cost increase. Moreover, by the method of introducing a flat layer having an intermediate refractive index between the substrate and the light emitting body, or by the method of introducing a flat layer having a lower refractive index than the glass substrate, there will exist, after all, an interface having a different refractive index, and there is little improvement in the taking out efficiency of lights.

Furthermore, as a combination of the above-mentioned technologies, the following organic EL display is disclosed in Patent document 7, for example. In one side of an organic EL element, a transparent material layer is formed through a minute ruggedness layer having a plurality of minute ruggedness with a pitch of 400 nm or less. This minute ruggedness layer is arranged to be located in the position opposing to the side of entering the light from the organic EL element. This minute ruggedness layer also serves as a hard coat layer.

However, the manufacturing process was complicated such as to form a rugged layer, to past this to a transparent material layer, and further to paste this so that the rugged portion will oppose to the substrate of the element. In addition, since the rugged portion is facing to the substrate of the element, an external force will be concentrated locally on the substrate through the convex part, and it may occur a problem of damaging the surface of the substrate.

It has been requested an improving means which enables to improve the followings at the same time: anti-scratch property of a surface of a plastic substrate; close adhesion between a substrate and an electrode layer; and taking out efficiency of light, without needing preparation of complicated element composition or plural component members.

PRIOR TECHNOLOGICAL DOCUMENTS

Patent Documents

Patent document 1: JP-A No. 2004-309932
Patent document 2: JP-A No. 2008-207401
Patent document 3: The U.S. Pat. No. 4,774,435
Patent document 4: JP-A No. 62-172691
Patent document 5: JP-A No. 2001-202827
Patent document 6: JP-A No. 11-283751
Patent document 7: JP-A No. 2007-213824

SUMMARY OF THE INVENTION

Problems to be Solved by the Invention

An object of the present invention is to provide an organic electroluminescence element and a lighting device using the same and a production method for this organic electroluminescence element. This organic electroluminescence element is produced by using a light transmissive resin substrate without using complicated element composition or plural component members, and the produced organic electroluminescence element is excellent in anti-scratch property of a surface of the substrate. It is improved in close layer adhesion between the substrate and the electrode layer without production of crack of the electrode layer and peeling from the substrate to result in no leak and short circuit of the element. The appearance of dark spots of the element is prevented and the bending resistance is improved and the taking out efficiency of lights is improved at the same time.

Another object of the present invention is to provide an organic electroluminescence element excellent in: preventing blocking from appearing when the foil sheet type organic electroluminescence elements are superimposed, or preventing blocking from appearing at a roll portion during the production using a roll-to-roll method. Further object of the present invention is to provide a lighting device using this organic electroluminescence element and a production method for the same.

Means to Solve the Problems

An object of the present invention described above has been achieved by the following constitutions.

1. An organic electroluminescence element comprising a light transmissive base material laminated thereon a transparent electrode, a light emitting layer and a counter electrode in this order, wherein the light transmissive base material contains a light transmissive resin substrate (resin substrate B) provided with a hard coat layer on both surfaces of the light transmissive resin substrate, the hard coat layers containing metal oxide nano particles; and the transparent electrode is formed on one hard coat layer (H1); and a rugged structure is formed on one surface of the other hard coat layer (H2), the one surface being opposite to another surface of the other hard coat layer (H2) which is contacted with the light transmissive resin substrate (resin substrate B).

2. The organic electroluminescence element described in the aforesaid item 1, wherein refractive indexes of the light transmissive base material (resin substrate B), the hard coat layer (H1), the hard coat layer (H2) and the transparent electrode each satisfy the following expressions (1) to (4).

$$-0.2 < n(H1)-n(A) < 0.2 \quad \text{Expression (1)}$$

$$-0.1 < n(H1)-n(B) < 0.1 \quad \text{Expression (2)}$$

$$-0.1 < n(H2)-n(B) < 0.1 \quad \text{Expression (3)}$$

$$-0.1 < n(H1)-n(H2) < 0.1, \quad \text{Expression (4)}$$

provided that, n(A): a refractive index of the transparent electrode,
n(H1): a refractive index of the hard coat layer (H1),
n(H2): a refractive index of the hard coat layer (H2),
n(B): a refractive index of the light transmissive resin substrate (resin substrate B).

3. The organic electroluminescence element described in the aforesaid items 1 or 2, wherein at least one of the refractive indexes of the hard coat layers, and the refractive index of the light transmissive resin substrate are 1.65 to 2.00.

4. The organic electroluminescence element described in any one of the aforesaid items 1 to 3, wherein the metal oxide nano particles are made of zirconium oxide or titanium oxide.

5. The organic electroluminescence element described in any one of the aforesaid items 1 to 4, wherein in a surface of the hard coat layer (H2), the rugged structure occupies 90% or more of the surface of the hard coat layer (H2).

6. The organic electroluminescence element described in any one of the aforesaid items 1 to 5, wherein the rugged structure has an average height of 1 to 50 μm.

7. The organic electroluminescence element described in any one of the aforesaid items 1 to 6, wherein the rugged structure has an average pitch of 1 to 50 μm.

8. The organic electroluminescence element described in any one of the aforesaid items 1 to 7, wherein the metal oxide nano particles have an average particle size of 1 nm to 100 nm.

9. A lighting device comprising the organic electroluminescence element described in any one of the aforesaid items 1 to 8.

10. A method of producing an organic electroluminescence element comprising a light transmissive base material laminated thereon a transparent electrode, a light emitting layer and a counter electrode in this order, provided that the light transmissive base material contains a light transmissive resin substrate (resin substrate B) provided with a hard coat layer on both surfaces of the light transmissive resin substrate, the hard coat layers containing metal oxide nano particles; and the transparent electrode is formed on one hard coat layer (H1); and a rugged structure is formed on one surface of the other hard coat layer (H2), the one surface being opposite to another surface of the other hard coat layer (H2) which is contacted with the light transmissive resin substrate (resin substrate B), wherein the method comprising the following steps (1) to (4) for forming the rugged structure provided on the one surface of the hard coat layer (H2):

(1) filling up or coating a mold having a rugged structure with a composition containing a curable resin;

(2) pasting the composition containing the curable resin which is filled up or coated on the mold having a rugged structure together with the resin substrate B;

(3) curing the composition containing the curable resin which is pasted together with the resin substrate B; and (4) demolding the resin substrate B from the mold in a condition that the aforesaid composition containing the curable resin pasted together with the aforesaid resin substrate B has been cured.

11. A method of producing an organic electroluminescence element comprising a light transmissive base material laminated thereon a transparent electrode, a light emitting layer and a counter electrode in this order, provided that the light transmissive base material contains a light transmissive resin substrate (resin substrate B) provided with a hard coat layer on both surfaces of the light transmissive resin substrate, the hard coat layers containing metal oxide nano particles; and the transparent electrode is formed on one hard coat layer (H1); and a rugged structure is formed on one surface of the other hard coat layer (H2), the one surface being opposite to another surface of the other hard coat layer (H2) which is contacted with the light transmissive resin substrate (resin substrate B), wherein the method comprising the following steps (5) to (8) for limning the rugged structure provided on the one surface of the hard coat layer (H2):

(5) forming a composition layer containing a curable resin on a surface of the resin substrate B;

(6) pasting a mold having a rugged structure together with the composition layer containing the curable resin formed on the surface of the resin substrate B;

(7) curing the composition layer containing the curable resin which is pasted together with the mold having the rugged structure;

(8) demolding the resin substrate B from the mold in a condition that the composition containing the curable resin pasted together with the resin substrate B has been cured.

12. The method of producing an organic electroluminescence element described in the aforesaid items 10 or 11, wherein refractive indexes of the light transmissive base material (resin substrate B), the hard coat layer (H1), the hard coat layer (H2) and the transparent electrode each satisfy the following expressions (1) to (4).

$$-0.2 < n(H1)-n(A) < 0.2 \quad \text{Expression (1)}$$

$$-0.1 < n(H1)-n(B) < 0.1 \quad \text{Expression (2)}$$

$$-0.1 < n(H2)-n(B) < 0.1 \quad \text{Expression (3)}$$

$$-0.1 < n(H1)-n(H2) < 0.1, \quad \text{Expression (4)}$$

provided that, n(A): a refractive index of the transparent electrode,
n(H1): a refractive index of the hard coat layer (H1),
n(H2): a refractive index of the hard coat layer (H2),
n(B): a refractive index of the light transmissive resin substrate (resin substrate B).

Effects of the Invention

By the present invention, it was possible to provide an organic electroluminescence element and a lighting device using the same and a production method for this organic electroluminescence element. This organic electroluminescence element is produced by using a light transmissive resin substrate without using complicated element composition or plural component members, and the produced organic electroluminescence element is excellent in anti-scratch property of a surface of the substrate. It is improved in close layer adhesion between the substrate and the electrode layer without production of crack of the electrode layer and peeling from the substrate to result in no leak and short circuit of the element. The appearance of dark spots of the element is prevented and the bending resistance is improved and the taking out efficiency of lights is improved at the same time.

The present invention made it also possible to provide an organic electroluminescence element excellent in: preventing blocking from appearing when the foil sheet type organic electroluminescence elements are superimposed, or preventing blocking from appearing at a roll portion during the production using a roll-to-roll method. Further, the present invention made it possible to provide a lighting device using this organic electroluminescence element and a production method for the same.

It was also possible to provide an organic electroluminescence element having a light transmissive base material provided with a hard coat layer having a rugged structure excellent in production efficiency and uniformity. And it was possible to provide a production method of this organic electroluminescence element. Moreover, it was possible to further improve the taking out efficiency of light from the organic electroluminescence element, without increasing the number of the component members.

EMBODIMENTS TO CARRY OUT THE INVENTION

Figure 1:
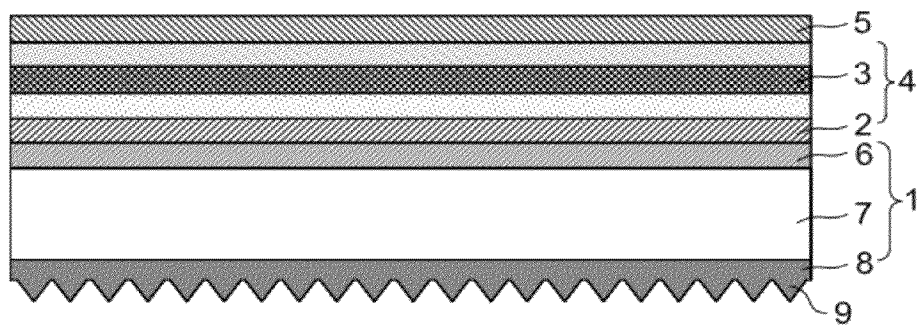
FIG. 1 is an example of a cross-sectional view of an organic electroluminescence element concerning the present invention.

Hereafter, the present invention and the constituting elements thereof will be described in detail.

An organic electroluminescence element of the present invention has the following features. It comprises a light transmissive base material laminated thereon a transparent electrode, a light emitting layer and a counter electrode in this order, wherein the light transmissive base material is composed of a light transmissive resin substrate (resin substrate B) provided with a hard coat layer on both surfaces of the light transmissive resin substrate, the both hard coat layers containing metal oxide nano particles; and the transparent electrode is formed on one hard coat layer (H1); and a rugged structure is formed on one surface of the other hard coat layer (H2), the one surface being opposite to another surface of the other hard coat layer (H2) which is contacted with the light transmissive resin substrate (resin substrate B).

[Light Transmissive Base Material]
[Light Transmissive Resin Substrate (Resin Substrate B)]

A resin film is preferably as a light transmissive resin substrate (Resin substrate B) used for an organic electroluminescence element relating to the present invention. It is preferable that the resin film is flexible resin film. Examples of resin film includes: polyesters such as polyethylene terephthalate (PET) and polyethylene naphthalate (PEN); polyethylene, polypropyrene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefine resins such as ARTON (produced by JSR Co. Ltd.) and APEL (produce by Mitsui Chemicals, Inc.)

In the present invention, it is preferable to use a polyester film such as polyethylene terephthalate and polyethylene naphthalate. In particular, extended polyethylene naphthalate is preferably used from the viewpoint of thermal resistivity.

In addition, it is preferable that a light transmissive resin substrate (Resin substrate B) relating to the present invention contains a light diffusing or non light diffusing filler in order to give a light diffusing property or to adjust a refractive index.

As a filler which is used, it can be used by choosing suitably after considering particle size and a refractive index from the well-known fillers which are made of inorganic compounds or polymers.

Examples of an inorganic compound include: silicon dioxide, titanium dioxide, aluminium oxide, zirconium oxide, calcium carbonate, talc, clay, calcined kaolin, calcined calcium silicate, hydrated calcium silicate, aluminium silicate, magnesium silicate, and calcium phosphate. Examples of a polymer include: a silicone resin, a fluororesin, and an acrylic resin.

As for the addition per unit in the case of adding these fillers to a hard coat layer or a transparent film, an amount of 0.1 to 30 mass % is desirable.

In the present invention, the refractive index of a light transmissive resin substrate (resin substrate B) is preferably 1.60 to 2.20, and especially preferably, it is 1.65 to 2.00.

In the present invention, the thickness of a transparent resin film is preferably 50 μm or more to 250 μm or less, and more preferably, it is 75 μm or more and 200 μm or less.

[Transparent Electrode]

As a transparent electrode used for an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized.

In the present invention, it is preferable that a transparent electrode is used as an anode. As for an anode, these electrode substances may be made into a thin layer by a method such as evaporation or spattering and a pattern of a desired form may be formed by means of photolithography, or in the case of requirement of pattern precision is not so severe (about 100 μm or more), a pattern may be formed through a mask of a desired form at the time of evaporation or spattering of the above-described substance. Alternatively, when coatable materials such as organic electrically conductive compounds are employed, it is possible to employ a wet system filming method such as a printing system or a coating system.

The sheet resistance as an anode is preferably not more than a few hundreds Ω/□. Further, although the layer thickness depends on a material, it is generally selected in a range of 10 to 1,000 nm and preferably of 10 to 200 nm.

In the present invention, the refractivity of the transparent electrode is preferably 1.5 to 2.0, and more preferably 1.6 to 1.9.

[Hard Coat Layer]

A hard coat layer the present invention is a layer having a pencil hardness according to JIS K 5600-5-4 of a rank "H" or more, and it is preferably a layer having a rank of "2H" or more. From the viewpoint of anti-scratching property, the hardness of the hard coat layer is preferably harder in the extent which does not produce neither breakage nor peeling of the layer when an external force such as bending is applied during the usage of an organic electroluminescence element.

Moreover, the hard coat layer concerning the present invention is characterized by dispersing metal oxide nano particles in a resin.

In the present invention, "metal oxide nano particles" mean the metallic oxide particle having an average size of less than 400 nm, preferably from 1 nm or more to less than 400 nm, more preferably from 1 nm or more to less 100 nm, still more preferably from 1 nm to 50 nm, further preferably from 1 nm to 30 nm, and most preferably from 1 nm to 20 nm.

If the average particle size is 1 nm or more, dispersion of the particles becomes easier and desired properties can be obtained. On the other hand, when the average particle size is 400 nm or more, there is a possibility that the produced hard coat layer may be opaque depending on the refractive index difference, and transparency may fall. Here, the average particle size means an average value of the diameter when each particle is converted into a sphere having the same volume (sphere conversion particle size).

In the hard coat layer of the present invention, by dispersing the metal oxide nano particles whose refractive index is higher than that of the light transmissive resin, it can be obtained a hard coat layer excellent in anti-scratching property, and having improved bending property, required refractive index and sufficient adhesion ability between the light transmissive resin substrate (resin substrate B), and between the transparent electrode.

Since it hardly has light scattering nature in the extent of the average particle size of the metal oxide nano particles concerning the present invention, there will be not produced trouble in transparency. In addition, although there is a technology disclosed in JP-A No. 2005-038661, for example, about the method of incorporating the light scattering particles in a visible light portion, and a filler with an aim to improve a light scattering function, there will be produced problems such as deterioration of transparency of the hard coat layer and insufficient close adhesion ability between the transparent electrodes. Therefore, this technology is different from the present invention. Moreover, for example, in WO 2009/081750, there is disclosed an organic electroluminescence element which has a resin composition layer having a rugged structure layer of a cone, a pyramid, or a prism form on the light extraction side of the element, and the resin composition layer contains particles having a refractive index difference with the resin in the range of 0.05 to 0.5, and having a particle size of 0.1 μm to 10 μm, An object of this technology is to improve taking out efficiency of lights and to decrease tincture change depending on the viewing angle. The particles are incorporated with an intention to decrease tincture change depending on a viewing angle by using light scattering nature of the particles in the visible light region, and unlike the present invention, there is no suggestion as to the above-mentioned effects other than optical taking out efficiency simultaneously attained by the composition of the present invention.

<<Metal Oxide Nano Particles>>

As metal oxide nano particles used for the present invention, it is preferable to use by suitably choosing the material which does not exhibits absorption, luminescence, and fluorescence in the wavelength portion used as an optical element.

As a metal composing the metal oxide nano particles, it can be used a metal oxide formed by one or more metals selected from the group consisting of: Li, Na, Mg, Al, Si, K, Ca, Sc, Ti, V, Cr, Mn, Fe, Co, Ni, Cu, Zn, Rb, Sr, Y, Nb, Zr, Mo, Ag, Cd, In, Sn, Sb, Cs, Ba, La, Ta, Hf, W, Ir, Tl, Pb, Bi, and a rare earth metal. Specific examples thereof are particles or complex particles having a refractive index satisfying 1.6 among the followings: titanium oxide, zinc oxide, aluminium oxide (alumina), zirconium oxide, hafnium oxide, niobium oxide, tantalum oxide, magnesium oxide, barium oxide, indium oxide, tin oxide, lead oxide; and lithium niobate, potassium niobate, lithium tantalate, aluminium magnesium oxide ($MgAl_2O_4$) which are complex oxides composed of these oxides. Among these particles, by considering inexpensiveness, safety, and easiness to achieve small size, it is preferable to select the following metal oxides: $TiO_2$, $Al_2O_3$, $LiNbO_3$, $Nb_2O_5$, $ZrO_2$, $Y_2O_3$, $MgO$, $ZnO$, $SnO_2$, $Bi_2O_3$, ITO, $CeO_2$, AlN, diamond, and KTaO3. Further, zirconium oxide($ZrO_2$) and titanium oxide($TiO_2$) are preferable.

As a preparation method of metal oxide nano particles, it is possible to obtain minute particles by spraying the raw material of the metal oxide nano particles in a gaseous phase, followed by calcinating. Furthermore, a method of preparing particles using plasma, a method of carrying out ablation of a raw material solid with laser, and a method of oxidizing an evaporated metal gas to prepare the minute particles can be used conveniently. Moreover, it is possible to prepare a metal oxide nano particle dispersion liquid which is dispersed as almost primary particles using a sol-gel method in a liquid phase. It is possible to obtain a dispersion liquid having a uniform particle size with a reactive crystallization method using the fall-off of solubility.

As for the particles obtained in the liquid phase, it is preferable to dry and calcine so as to stably pull out the function of metal oxide nano particles. For drying, there are applicable the means, such as freeze drying, spray drying, and supercritical drying. For calcination, it is preferable not only to use an elevated temperature with controlling an atmosphere, but to carry out by using organic or inorganic sintering inhibitor.

The hard coat layer concerning the present invention is characterized by the content of metal oxide nano particles being 5 vol % or more to 50 vol % or less. Especially, when metal oxide nano particles with an average particle size of 50 nm or less are used, it is substantially difficult for the content to exceed 50 vol %, and when maintaining of moldability is considered (with keeping fluidity and no crack), it is preferable that the content is less than 30 vol %. Especially, when the content of the metal oxide nano particles exceeds 30 vol %, it is preferable to perform surface treatment to the surface of metal oxide nano particles so as to raise affinity with resin. On the other, in order to adjust a refractive index and to raise adhesion by incorporating metal oxide nano particles, a certain amount of the content is required. It is preferable that the content is 5 vol % or more, and more preferably, the content is 10 vol % or more. In order to achieve compatibility of maintaining of moldability, adjustment of a refractive index, and improvement of close adhesion, the content of the metal oxide nano particles is preferably 10 vol % to 30 vol %, and more preferably, it is 10 vol % to 20 vol %. The volume fraction of metal oxide nano particles here can be obtained by the following procedure. An arbitral volume of the resin dispersed with metal oxide nano particles, which composes a hard coat layer, is taken out. The volume is set as "Y" $cm^3$, the specific gravity of the metal oxide nano particles contained in this resin is set to "a", and the total content of the metal oxide nano particles is set to "x" gram. The volume fraction is determined by a formula: $(x/a)/Y \times 100$. The content of the metal oxide nano particles can be determined by extracting the metal oxide nano particles contained in the resin and measuring the weight. It can be applied observation of the particle image with an transmission electron microscope (TEM) (which enables to obtain information about particle composition with local elementary analysis such as EDX). Or the content can be calculated from the content mass of the target composition determined by the elementary analysis of the ash contained in the given resin composition and the specific gravity of the crystal to be measured.

Regarding the increase in the refractive index of the resin composition which constitutes the hard coat layer when the metal oxide nano particles are added, it is preferable to be 0.02 or more with respect to the original resin, and it is more preferable to be 0.05 or more.

<<Surface Treating Agent>>

It is preferable that the metal oxide nano particles are subjected to a surface treatment in order to increase affinity with the resin since it is necessary to homogeneously disperse with the resin. Although the following approaches can be considered for binding a required surface treating agent and a particle surface, it is not restricted to them.

A. Physical adsorption (surfactant treatment having secondary bonding nature)
B. Reaction using surface chemical species (covalent bond formation with a surface hydroxyl group)
C. Introduction to surface and reaction of active species (introduction of active point such as radical and graft polymerization, high energy beam exposure and graft polymerization)
D. Resin coating (encapsulation, plasma polymerization)
E. Deposition immobilization (deposition of poorly soluble organic acid salt)

Further, specific examples will be described below.

(1) Silane Coupling Agent

A condensation reaction and a hydrogen bond of a silanol group and a hydroxyl group on the surface of a particle are used. Preferable examples are: vinylsilazane, trimethylchlorosilane, dimethyldichlorosilane, methyltrichlorosilane, trimethyl alkoxy silane, dimethyl alkoxy silane, methyltrialkoxy silane, and hexamethyldisilazane. More preferable examples are: trimethylmethoxysilane, dimethyldimethoxysilane, methyltrimethoxysilane, and hexamethyldisilazane.

(2) Other Coupling Agent

It can be applied coupling agents such as titanate, aluminate and zirconate. It can also be used zircoaluminate, chromate, borate, stannate, and isocyanate.

(3) Surface Adsorbent

Alcohol, nonion surfactant, ionic surfactant, carboxylic acid, and amine are applicable.

(4) Resin Surface Treatment

There are approaches such as: introducing an active species on a surface of a particle with the above-mentioned methods (1) to (3) followed by proving a polymer layer on the surface with graft polymerization, and allowing to adsorb or combine a polymer dispersing agent which is synthesized beforehand on a surface of a particle. In order to form a polymer layer firmly on a particle surface, it is preferable to carry out a graft polymerization and especially it is preferable to carry out a high graft polymerization.

<<Production Method of Hard Coat Layer Containing Metal Oxide Nano Particles>>

In the production of a hard coat layer containing metal oxide nano particles of the present invention, it is formed as follows. First, a composite material precursor (when a thermoplastic resin is used, it is in a melted state; and when a curable resin is used, it is in a non-cured state) is prepared. Then, a hard coat film is formed by coating on a resin substrate B, or a hard coat film is formed by adhering the resin layer, which is formed in a mold by coating, with a resin substrate B.

When a curable resin is used in particular, a composite material precursor may be prepared by mixing the curable resin dissolved in an organic solvent with the metal oxide nano particles concerning the present invention, and then by removing the organic solvent after that. It may be prepared by adding and mixing the metal oxide nano particles into a monomer solution which is one of the raw materials of the curable resin polymerized, and then by polymerizing the monomer. Moreover, it may be prepared by melting an oligomer in which a part of monomer is polymerized, or the polymer of low molecular weight, and then by adding and mixing the metal oxide nano particles concerning the present invention to that.

As an organic solvent used here, it can be chosen from the following: a lower alcohol with 1 to 4 carbon toms; a ketone such as acetone, methyl ethyl ketone, and methyl isobutyl ketone; and a hydrocarbon such as toluene and xylene. As long as it has a boiling point lower than a monomer and moreover it has compatibility with the monomer, the organic solvent will not be limited in particular.

In the present invention, it is especially preferable to apply a method of preparing a highly viscous solution obtained by mixing with the monomer and the metal oxide nano particles concerning the present invention, then by mixing this solution with giving a share while cooling. At this time, it is also important to adjust viscosity of the solution so that dispersion of the metal oxide nano particles concerning the present invention into the curable resin may become optimized. As the way of viscosity control, tuning of the particle size of the metal oxide nano particle concerning the present invention, a surface state, and an addition per unit, a solvent, the addition of a viscosity modifier, etc. are cited. As the way of viscosity control, it can be cited adjustment of the particle size, the surface state, and the addition amount of the metal oxide nano particles concerning the present invention, and addition of a solvent and a viscosity modifier. The metal oxide nano particles concerning the present invention can acquire an optimal kneading state because surface modification is easily done resulting from the structure.

When giving a share to obtain a composite, the metal oxide nano particle concerning the present invention can be added in a powder state or in an aggregation state. Or it is also possible to add them in a state of dispersed in a liquid. When adding in a state of dispersed in a liquid, it is preferable to carry out deaeration after mixing.

When the metal oxide nano particles are added in a state of dispersed in a liquid, it is preferable to break the aggregated particles into primary particles beforehand and to add. Although various homogenizers can be used for dispersing, especially a bead mill is desirable. Although there are a various materials for glass beads, a small size of magnitude is preferable, and especially, the beads having a diameter of 0.001 to 0.5 mm are preferable.

It is preferable that the metal oxide nano particles concerning the present invention are added in a state of being subjected to a surface treatment. It is also possible to use a method like an integral blend in which a surface treating agent and particles are added simultaneously and a composite structure is formed with a curable resin.

<<Resin Monomer Used for a Hard Coat Layer>>

A resin used for a hard coat layer concerning the present invention is preferably a curable resin. More preferably, it is an actinic ray curable resin. An actinic ray curable resin contains, as a main ingredient, a resin which is cured through a cross-linking reaction by irradiation with an actinic ray such as a UV ray or an electron beam. As an actinic ray curable resin, preferably used ingredient is a monomer having an ethylenically unsaturated double bond. A hard coat layer is formed by irradiation with an actinic ray such as a UV ray or an electron beam. Although a UV light curable resin and an electron beam curable resin are cited as a representative actinic ray curable resin, a resin cured by UV irradiation is preferable.

These hard coat layers can be coated with well-known ways such as: a gravure coater, a dip coater, a reverse coater, a wire bar coater, a die coater, and the ink-jet method.

As a light source used for forming a cured coating layer by curing a UV light curable resin with a light curing reaction, a light source generating UV lights can be used without a restriction.

Examples thereof are: a low-pressure mercury lamp, an medium-pressure mercury lamp, a high-pressure mercury lamp, an ultrahigh-pressure mercury lamp, a carbon arc light, a metal halide lamp, and a xenon lamp. Although exposure conditions change depending on each lamp, an amount of irradiation of an actinic ray is usually 5 to 500 mJ/cm$^2$, preferably, it is 5 to 150 mJ/cm$^2$, and more preferably, it is 20 to 100 mJ/cm$^2$.

<<Formation of a Hard Coat Layer>>

From the viewpoint of forming a hard coat layer which is excellent in anti-scratching property and has a desired refractive index with a sufficient adhesion between light transmissive resin substrates (resin substrate B) and between transparent electrode, a hard coat layer has preferably a thickness of 1 μm to 100 μm, and more preferably a thickness of 2 μm to 50 μm. A hard coat layer is coated respectively on both sides of the resin film. Although the thickness ratio of a hard coat layer (H1) and a hard coat layer (H2) can be adjusted according to the balance such as curl, the thickness difference of these two hard coat layers is preferably 10 μm or less. Moreover, the film thickness of the hard coat layer (H1) is preferably smaller than the thickness of the transparent electrode and the resin film thickness considering an optical property.

The refractive index of a hard coat layer is preferably adjusted so that the difference of the refractive index between the transparent electrode and transparent resin film to be used may become small by considering an optical property and membrane physical property. The difference of the refractive index between the hard coat layer (H1) concerning the present invention and the transparent electrode is preferably less than 0.2, and more preferably, it is less than 0.15. The difference of the refractive index between the hard coat layer (H1) or the hard coat layer (H2) concerning the present invention and the transparent and light transmissive resin substrates (resin substrate B) is preferably less than 0.1, and more preferably, it is less than 0.05. The difference of the refractive index between the hard coat layer (H1) and the hard coat layer (H2) is preferably less than 0.1, and more preferably, it is less than 0.05. The most preferable case is to have the same refractive index.

In the present invention, the refractive indexes of the hard coat layer (H1) and the hard coat layer (H2) each are preferably 1.65 to 2.00, more preferably, 1.70 to 2.00, and still more preferably, 1.75 to 2.00.

In the present invention, it is preferable that the refractive indexes of the aforesaid light transmissive resin substrate (resin substrate B), the aforesaid hard coat layer (H1), the aforesaid hard coat layer (H2), and the aforesaid transparent electrode satisfy the following expressions (1) to (4).

$-0.2 < n(H1) - n(A) < 0.2$  Expression (1)

$-0.1 < n(H1) - n(B) < 0.1$  Expression (2)

$-0.1 < n(H2) - n(B) < 0.1$  Expression (3)

$-0.1 < n(H1) - n(H2) < 0.1$,  Expression (4)

provided that,
n(A): a refractive index of the transparent electrode,
n(H1): a refractive index of the hard coat layer (H1),
n(H2): a refractive index of the hard coat layer (H2),
n(B): a refractive index of the light transmissive resin substrate (resin substrate B).

In Expression (1) of the present invention, it is preferable that Expression (1a) is further satisfied, and moreover, it is preferable that Expression (1b) is further satisfied.

$-0.1 < n(H1) - n(A) < 0.1$  Expression (1a):

$n(H1) \leq n(A)$  Expression (1b):

In Expression (2) and Expression (3) of the present invention, it is preferable that Expression (2a) and Expression (3a) are further satisfied, and moreover, it is preferable that Expression (2b) and Expression (3b) are further satisfied.

$-0.05 < n(H1) - n(B) < 0.05$  Expression (2a)

$-0.05 < n(H2) - n(B) < 0.05$  Expression (3a)

$n(H1) \leq n(B)$  Expression (2b)

$n(H2) \leq n(B)$  Expression (3b)

In Expression (4) of the present invention, it is preferable that Expression (4a) is further satisfied, and moreover, it is preferable that Expression (4b) is further satisfied.

$-0.05 < n(H1) - n(H2) < 0.05$  Expression (4a)

$n(H1) = n(H2)$  Expression (4b)

In the present invention, it is preferable that the following Expressions (5) to (7) are satisfied.

$d(H1) > d(A)$  Expression (5)

$d(H1) < d(B)$  Expression (6)

$-10 \text{ μm} < d(H2) - d(H1) < +10 \text{ μm}$  Expression (7)

provided that,
d(A): a thickness of the transparent electrode
d(H1): a thickness of the hard coat layer (H1)
d(H2): a thickness of the hard coat layer (H2)
d(B): a thickness of the light transmissive resin substrate (resin substrate B).

By the above-described preferable embodiments of the present invention, it is possible not only to improve the taking out efficiency of lights, which is conventionally known in the art, but to improve the membrane physical property of the organic electroluminescence element having a microscopic membrane composition to a large extent.

[Measuring Method of a Refractive Index]

In the present invention, a conventionally known measuring method for a refractive index can be used.

For example, it can be obtained from the measurement result of the spectral reflection ratio for the samples each coated with a single layer by using a spectrophotometer (for examples, U-4000 made by Hitachi Co., Ltd.). It can also be obtained from the measurement of the sample being subjected to a surface treatment to become coarse, then applied with a black spray so as to absorb light to result in preventing the reflection of the rear side. By measuring the reflection ratio of the aforesaid sample in the visible region (400 to 700 nm) with a condition of 5 degree normal reflection, the refractive index can be determined.

The organic electroluminescence element concerning the present invention is characterized by a light transmissive base material having a rugged structure on one surface side of the hard coat layer (H2) on the light transmissive resin substrate, the one surface side being opposite to another surface side of the hard coat layer (H2) which is contacted with the light transmissive resin substrate (resin substrate B).

FIG. 1 is an example of a cross-sectional view of an organic electroluminescence element concerning the present invention.

On a light transmissive base material 1, there are laminated thereon a transparent electrode 2, functional layers 4 containing a light emitting layer 3 and a counter electrode 5 in this order. The light transmissive base material 1 is composed of a hard coat layer (H1) 6, a light transmissive resin substrate (resin substrate B) 7, and a hard coat layer (H2) 8. One surface of the hard coat layer (H2) is provided with a rugged structure 9. The functional layers 4 containing the light emitting layer 3 may further contain a charge injection layer, an electron transport layer, an insulating layer, a carrier block layer, an interlayer, a light controlling layer, a protective film, a bather layer, and a mixed layer of these other than the light emitting layer when required. Further, although it is omitted in the figure, it is also possible to prepare a sealing film, a bather film, a protective film, an auxiliary electrode, a (water) getting agent, if needed. The light emitting layer 3 may be composed of a plurality of light emitting layer, and it may be laminated with an electrode other than the transparent electrode 2 and the counter electrode 5, a charge generating layer or a various kind of interlayers between the light emitting layers.

In the present invention, the aforesaid rugged structure is located on one surface side of the hard coat layer (H2) in two dimensional state, the one surface side being opposite to the resin substrate B. Although the shape, height, width, and pitch of the aforesaid rugged structure may be regular or may be irregular, it is preferable to be arranged regularly.

The form of the section of a convex part can be arbitrarily chosen from forms, such as a triangle, a trapezoid, a circle, and a rectangle, and a semicircle, a partial circle, or a half-ellipse, and the form of the convex part observed from the normal direction of the hard coat layer (H2) can be arbitrarily chosen from a triangle, a square, other polygons, a circle, and an ellipse.

Although the form and size of this convex part may be regular or irregular, it is preferable to have a regular form and a regular size of a pyramid, a cone, a truncated pyramid, a truncated cone, or a sphere, and it is more preferable to have a pyramid, a cone, a truncated pyramid, a truncated cone, or a sphere.

Hard Coat Layer (H2)

An average height of this rugged structure is preferably 1 to 50 μm, more preferably, it is 5 to 40 μm, and most preferably, it is 10 to 30 μm.

An average pitch of this rugged structure is preferably 1 to 50 μm, more preferably, it is 5 to 40 μm, and most preferably, it is 10 to 30 μm.

When the form of the section of a convex part is a pyramid, a cone, a truncated pyramid, or a truncated cone, as for the vertical angle θ at the tip of a convex part (angle of the intersection point of the straight lines which are extended from the slope of the convex part section when it is a truncated pyramid or a truncated cone), it is preferable to be 30 to 90 degrees, and it is more preferably to be 40 to 70 degrees.

Figure 2A:
FIGS. 2a to 2n show examples indicating a cross-sectional view of a rugged structure on a hard coat layer (H2) concerning the present invention.
Figure 2B:
Figure 2C:
Figure 2D:
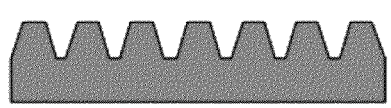
Figure 2E:
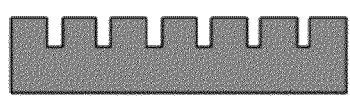
Figure 2F:
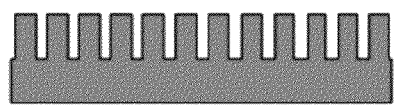
Figure 2G:
Figure 2H:
Figure 2I:
Figure 2J:
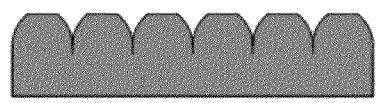
Figure 2K:
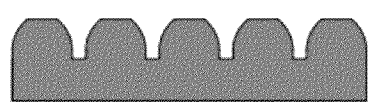
Figure 2L:
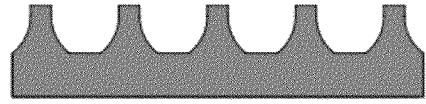
Figure 2M:
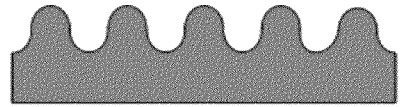
Figure 2N:

Although examples of a sectional form of the rugged structure on the hard coat layer (H2) concerning the present invention are shown in FIGs. (a) to (n), it is not limited to these. in FIGS. 2(a) to (n), although each rugged structure has arranged in the same size and the same form, the size and form of each rugged structure may be different.

FIGS. 3(a) to (h) and FIGS. 4(a) to (e) show examples of the rugged structure on a hard coat layer (H2) concerning the present invention viewed from the surface normal direction.

The following figures indicate each case.

Figure 3A:
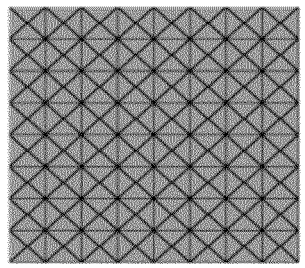
FIGS. 3a to 3h show examples of a rugged structure on a hard coat layer (H2) concerning the present invention viewed from the normal direction of the surface.
Figure 3E:
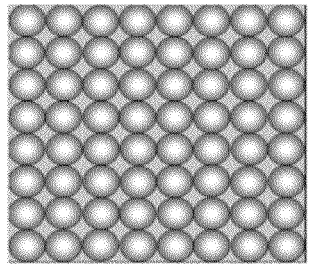
Figure 3B:
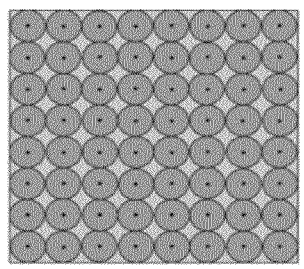
Figure 3F:
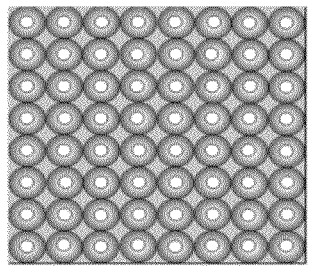
Figure 3C:
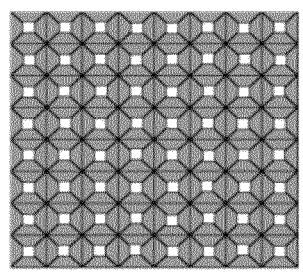
Figure 3G:
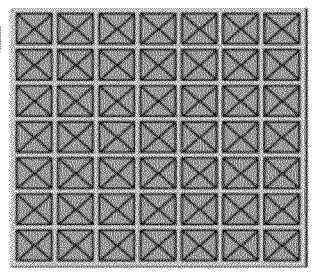
Figure 3D:
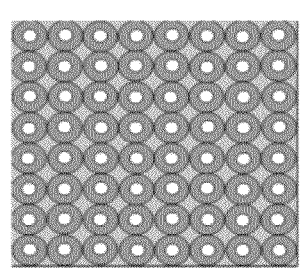
Figure 3H:
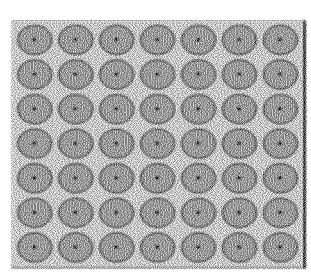
Figure 4A:
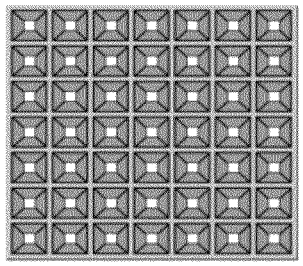
FIGS. 4a to 4e show examples of a rugged structure on a hard coat layer (H2) concerning the present invention viewed from the normal direction of the surface.
Figure 4E:
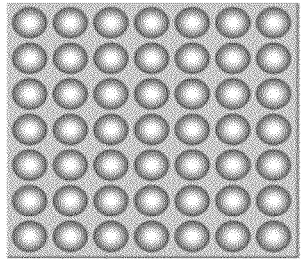
Figure 4B:
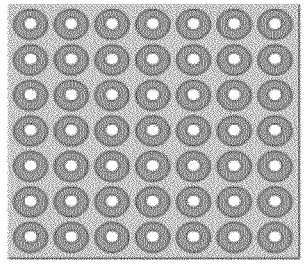
Figure 4C:
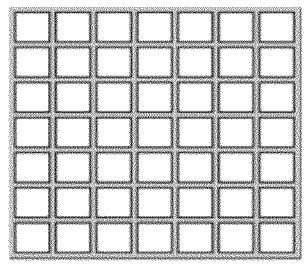
Figure 4D:
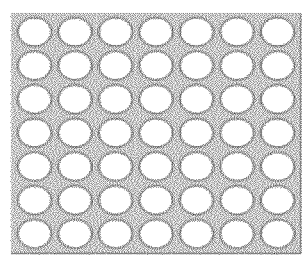

FIG. 3(a) indicates the case having a sectional form of FIG. 2(a) and a convex part of a pyramid;

FIG. 3(b) indicates the case having a sectional form of FIG. 2(a) a convex part of a cone;

FIG. 3(c) indicates the case having a sectional form of FIG. 2(c) a convex part of a truncated pyramid;

FIG. 3(d) indicates the case having a sectional form of FIG. 2(c) a convex part of a truncated cone;

FIG. 3(e) indicates the case having a sectional form of FIG. 2(g) a convex part of a hemi-sphere;

FIG. 3(f) indicates the case having a sectional form of FIG. 2(j) a convex part of a truncated cone having a round side;

FIG. 3(g) indicates the case having a sectional form of FIG. 2(b) a convex part of a pyramid;

FIG. 3(h) indicates the case having a sectional form of FIG. 2(b) a convex part of a cone;

FIG. 4(a) indicates the case having a sectional form of FIG. 2(d) a convex part of a truncated pyramid;

FIG. 4(b) indicates the case having a sectional form of FIG. 2(d) a convex part of a truncated cone;

FIG. 4(c) indicates the case having a sectional form of FIG. 2(e) a convex part of a quadrangular prism;

FIG. 4(d) indicates the case having a sectional form of FIG. 2(e) a convex part of a round column; and FIG. 4(e) indicates the case having a sectional form of FIG. 2(h) a convex part of a hemi-sphere.

In the present invention, the above-mentioned rugged structure occupies 90% or more of the surface area of this hard coat layer (H2) in the surface of a hard coat layer (H2). This means as follows. In the field obtained by observing the hard coat layer (H2) surface from the normal direction of the radiation direction with respect to the surface side of the light transmissive resin substrate (resin substrate B) of a light transmissive base material, the area in which the convex part of rugged structure occupies in an amount of 90% or more of the area within the field obtained by observing the hard coat layer (H2) surface. It is more preferable to occupy 95% pr more, and most preferable to occupy 97% or more.

In the present invention, the above-mentioned convex part is a portion which forms the convex part which has a slope of the angle of 0 degree or more with respect to the surface of the light transmissive resin substrate (resin substrate B) in the above-mentioned light transmissive base material.

Figure 5:
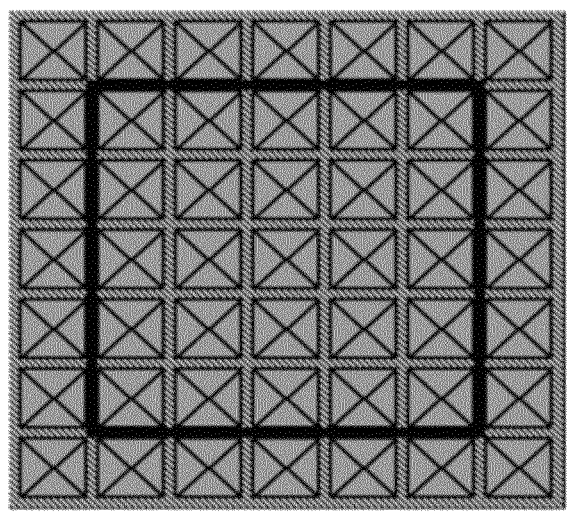
FIG. 5 shows an example of a rugged structure on a hard coat layer (H2) concerning the present invention viewed from the normal direction of the surface.

For example, when a convex part is a pyramid (the aforesaid FIG. 3 (g)), among the surface of the hard coat layer (H2) indicated with the slash lines as indicated by FIG. 5, it is an area which is occupied by the convex part in the surface of the region surrounded by the heavy line.

In addition, in the present invention, when evaluating the area of the rugged structure occupying the surface area of the hard coat layer (H2), an edge portion is not included among the hard coat layer (H2) surface. That is, the portion of the convex part which constitutes the edge portion (outside of the portion surrounded by the heavy line in FIG. 5) is removed, and the area which is occupied by a convex part is evaluated.

In order to form a rugged structure concerning the present invention on a surface of a hard coat layer (H2), the following various ways can be used suitably: a method using a tabular-, sheet-, or roll-shaped mold; and a method of forming a pattern on a surface of a resin layer or a resin sheet using a photolithography or laser processing in the art, followed by transferring. Moreover, for example, an imprint approach can be used. This method contains as follows, for example: after forming a film of a composition containing a curable resin used for a hard coat layer; before curing the film, a tabular-, sheet-, or roll-shaped mold provided with a rugged structure on the surface of the mold is pressed on the film; then the rugged structure of the mold is transferred by solidifying. In addition, it can be used the following method: after coating a resin composition used for a hard coat layer; then closely sticking a mold provided with a rugged structure on the coated resin and solidifying to transfer the wave shape of the molding.

In the present invention, it is preferable to form a rugged structure on a surface of a hard coat layer (H2) by a method containing the following manufacturing processes (1) to (4).

(1) A manufacturing process of filling up or coating a mold having a rugged structure with a composition containing a curable resin.

(2) A manufacturing process of pasting the composition containing the curable resin filled up or coated on the aforesaid mold having the rugged structure together with the aforesaid resin substrate B.

(3) A manufacturing process of curing the composition containing the curable resin which is pasted together with the aforesaid resin substrate B.

(4) A manufacturing process of demolding the aforesaid resin substrate B from the aforesaid mold in a condition that the aforesaid composition containing the curable resin pasted together with the aforesaid resin substrate B has been cured.

FIGS. 6(a) to (e) are a process chart indicating an embodiment of an organic electroluminescence element of the present invention which forms a rugged structure on a hard coat layer (H2) by the method containing the aforesaid manufacturing processes (1) to (4).

Figure 6A:
FIGS. 6a to 6e show a process chart indicating an embodiment to form a rugged structure on a hard coat layer (H2).

FIG. 6(a) shows a mold 41 provided with a rugged structure. The mold may be coated with a releasing agent which will be described later.

Figure 6B:

Subsequently, in FIG. 6(b), a hard coat resin composition 42 dissolved in a solvent is coated on the mold 41.

Figure 6C:
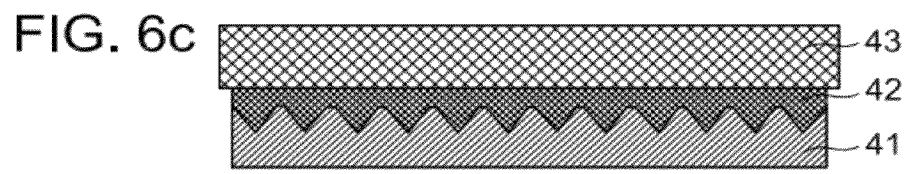

In FIG. 6(c), a resin substrate B(43) is pasted before the hard coat resin composition 42 is cured.

Figure 6D:
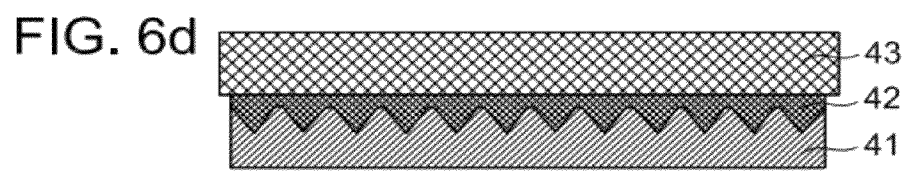

In FIG. 6(d), the hard coat resin composition 42 is cured and it is closely pasted with the resin substrate B(43).

Figure 6E:
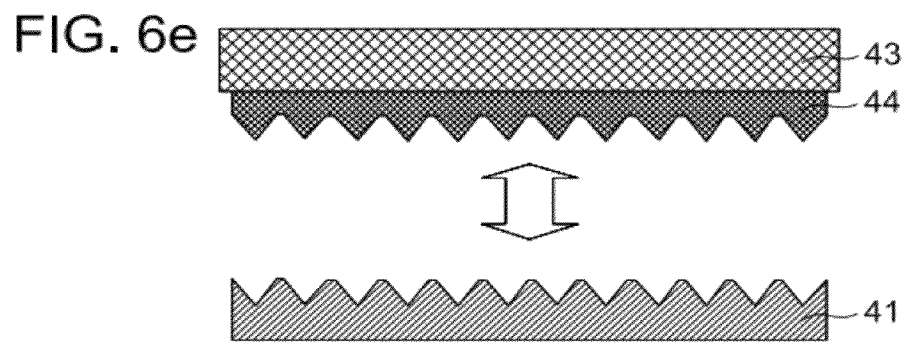

In FIG. 6(e), the resin substrate B(43) is demolded from the mold 41, and a hard coat resin composition layer 44 having a rugged structure is formed on the resin substrate B(43).

Moreover, in the present invention, it is preferable to form a rugged structure on a surface of a hard coat layer (H2) by a method containing the following manufacturing processes (5) to (8).

(5) forming a composition layer containing a curable resin on a surface of the aforesaid resin substrate B.

(6) pasting a mold having a rugged structure together with the aforesaid composition layer containing the curable resin formed on the surface of the aforesaid resin substrate B;

(7) curing the aforesaid composition layer containing the curable resin which is pasted together with the aforesaid mold having the rugged structure;

(8) demolding the aforesaid resin substrate B from the aforesaid mold in a condition that the aforesaid composition containing the curable resin pasted together with the aforesaid resin substrate B has been cured.

FIGS. 7(a) to (e) are a process chart indicating an embodiment of an organic electroluminescence element of the present invention which forms a plurality of rugged structures on a hard coat layer (H2) by the method containing the aforesaid manufacturing processes (5) to (8).

Figure 7A:
FIG. 7 is a process chart indicating another embodiment to form a rugged structure on a hard coat layer (H2).

FIG. 7(a) shows a resin substrate B(53).

Figure 7B:

Subsequently, in FIG. 7(b), a hard coat resin composition layer 52 is coated on the resin substrate B(53). And a mold 51 provided with a rugged structure is procured. The mold may be coated with a releasing agent which will be described later.

Figure 7C:
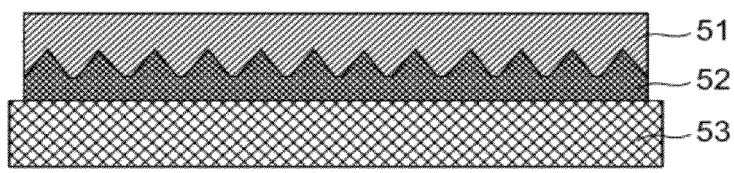

In FIG. 7(c), the mold 51 is pasted together before the hard coat resin composition layer 52 is cured.

Figure 7D:
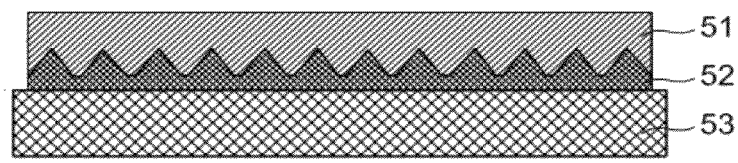

In FIG. 7(d), the hard coat resin composition layer 52 is cured and it is closely pasted with the resin substrate B(53), and at the same time, a rugged structure is formed on a surface of the hard coat resin composition layer 52

Figure 7E:

In FIG. 7(e), the resin substrate B(53) is demolded from the mold 51, and a hard coat resin composition layer 54 having a rugged structure is formed on the resin substrate B(53).

In the above-mentioned explanation, although a tabular mold which was prepared a rugged structure on the surface was used, it can also be used a sheet-shaped mold or a roll-shaped mold such as an embossed roll which is provided with a rugged structure on the surface. By using a film-shape mold or a roll-shape mold, manufacturing speed can be increased, and curing of the resin composition for a hard coat layer can be quickened, and at the same time, it is possible to improve the uniformity of the rugged structure. Each of these advantages enables to realize a high productivity and a high uniformity of the light transmissive base material which is provided with a hard coat layer having a rugged structure.

Although it can use a resin composition for a hard coat layer containing a curable resin which will be cured by irradiation with an actinic ray such as an UV ray or an electron beam, by heating or by evaporation and drying of a solvent, it is preferable that the resin composition contains a resin hardened by irradiation with an actinic ray.

In the present invention, by closely contacting with a light transmissive resin substrate (resin substrate B) before the curable resin used for a hard coat layer hardens, it is possible to increase the adhesive strength of the resin with the light transmissive resin substrate (resin substrate B) after hardening, even if an adhesion layer is not used.

In order to further improve the adhesion of a substrate with a liquid composition, it is possible to use a substrate which is soluble in the solvent of the liquid composition. The substrate is dissolved by the solvent, and the adhesion strength can be further improved.

Below, it will be further described in detail the materials and the production ways which can be used for forming a plurality of rugged structures on a hard coat layer (H2) in the present invention.

(Preparation Method of Mold (or Die))

As a preparation method of a minute rugged form, the following can be applied. The minute rugged form can be prepared by forming a latent image on a resist with an optical drawing (such as mask light exposure, reduced projection exposure, interference exposure) or an electron beam lithography, followed by developing the latent image to produce a rugged pattern. As an approach of producing especially a rugged form of a large area with sufficient manufacturing efficiency, an optical drawing approaches, such as 2 light beams interference exposure, are excellent. A mold may be produced with an electrocasting technique from the produced rugged structure made of the resist. And by etching the resist as a mask, and by transferring the form to silicon, quartz glass, or metal, it can be processed to make a mold. Moreover, the form is transferred on the resin sheet from the mold produced by one of the approaches, and it can be made as a mold as it is, or it can be transferred by electrocasting from the resin sheet, and it can be made a mold.

<Specific Preparation Method of Mold: Laser Interference Exposure Method>

A UV laser (having a wavelength of 266 nm) is used, a liquid immersion of 2 light beams interference exposure is performed with 35 degree of inclination to a normal direction, and interference fringes are formed on a resist. "MBD266" (made by Coherent Co., Ltd." is used as a laser light source. A negative type resist which remains a resist in a light exposure part is used. "TDUR-009P" (made by Tokyo Ohka Kogyou Co., Ltd.) is used as a negative type resist. As a liquid immersion exposing optical system, a beam diameter of 80 mm is used and the area except the exposure area is masked and that area is made as an unexposed part.

After development, it is formed a minute groove structure with a detailed drawing size of 50 mm square on a quartz glass (70 mm square and having a thickness of 1.2 mm) by dry etching.

To a whole surface of a resin substrate (acrylic resin having a thickness of 1 mm) of 1,000 mm square is transferred a rugged structure from the mother die of a quartz glass with a drawing size of 50 mm square using a step & repeat method by a nano imprint (heat imprint). By carrying out nickel electroforming to the prepared resin substrate, a nickel mold (1,000 mm square and having a thickness of 1 mm) is created.

There is another method as follows: a UV curing resin is applied to a resin substrate (acrylic resin having a thickness of 1 mm) of 1,000 mm square, and carrying out pressing of a quartz glass of a drawing area 50 mm square (substrate size of 70 mm square), and carrying out UV curing of the drawing area 50 mm square with a step & repeating method to transfer the rugged structure to the whole surface.

By carrying out nickel electroforming to the prepared resin substrate, a nickel mold (1,000 mm square and having a thickness of 1 mm) is created.

There is still another method as follows: a resin is applied to a quartz substrate of 1,000 mm square (having a thickness of 1 mm), then carrying out a liquid immersion of 2 light beams interference exposure with a UV laser (having a wavelength of 266 nm) to form interference fringes on a resist. As a liquid immersion exposing optical system, a beam diameter of 80 mm is used and the area except the exposure area is masked and that area is made as an unexposed part. By transporting the quartz substrate of 1,000 mm square in an amount corresponding to the exposure area, a whole area exposure is performed. The quartz substrate of 1,000 mm square is developed followed by nickel electroforming to form a large sized nickel mold (1,000 mm squares and having a thickness of 1 mms) is created.

<Coating of a Releasing Agent>

In the present invention, in order that the cured resin composite may be demolded with attached to the side of the light transmissive base material (resin substrate B), it is preferable to coat a mold releasing agent. As an example of a mold releasing agent, it is preferable to use a silane coupling agent containing a chloro fluorinated resin such as tridecafluoro-1, 1,2,2-tetrahydrooctyl trichlorosilane ($CF_3$—$(CF_2)_5$—$CH_2$—$CH_2SiCl_3$). The mold made of quartz glass is subjected to a surface treatment and a chemical adsorption film of a fluororesin is produced on a detailed shaped surface. The detail is described in Non-patent documents 3 and 4 shown below.

Non-patent document 3: M. Colburn, S. Johnson, M. Stewart, S. Damle, T. Bailey, B. Choi, M. Wedlake, T. Michaelson, S. V. Sreenivasan, J. Ekerdt and C. G. Willson, Proc. of SPIE 3676, (1999) 378.

Non-patent document 4: T. Bailey, B. J. Choi, M. Colburn, M. Meissl, S. Shaya, J. G. Ekerdt, S. V. Sreenivasan, C. G. Willson; "Step and Flash Imprint Lithography: Template Surface Treatment and Defect Analysis" J. Vac. Sci. Technol. B, 18(6), 3572-3577 (2000).

The optimum releasing process is chosen by the combination of a resin composite and a mold. Generally, under the state in which the resin composite has been solidified, it is desirable that a mold-releasing characteristic with a mold to be high. If a mold-releasing characteristic is insufficient, it may occur an inconvenience such as poor transfer or generation of a remaining film to a mold. On the other hand, in a liquid state, it is desirable that wettability with a mold is good. If wettability is insufficient, a liquid composition will not easily enter into fine shape, and it will become easy to generate a poor transfer.

Moreover, when the mold is made of a fluororesin and the mold-releasing characteristic between the liquid composition after solidified and the mold is intrinsically good, it is not necessary to perform a mold releasing treatment.

The viscosity of a liquid composition is preferably to be low from the viewpoint of filling up the fine structure of the mold with the liquid composition. Specifically, the viscosity of a liquid composition is preferable in the range 1 mPa·s to 50 Pa·s, more preferably, it is in the range 2.5 mPa·s to 0.1 Pa·s. As a means to reduce the viscosity of a liquid composition, it is possible to adjust by choosing the composition of the above-mentioned solvents, solids concentration, and the amount of molecular weight of the resin. Moreover, the viscosity of a liquid composition can also be adjusted by adding a suitable plasticizing agent for the resin.

(Coating of a Resin Composition)

As a means to coat a resin composition on a mold or a light transmissive base material (resin substrate B), it can be used a coating method such as a spin coating, an ink-jet method and an extruding coating.

The liquid composition needs to be chosen appropriately according to the size of the rugged form with respect to the requirements, such as viscosity, molecular weight, and wettability to a mold.

When a rugged form is detailed, the liquid composition of low viscosity and low molecular weight is preferable, since the liquid can enter into the rugged form easily. Moreover, the liquid composition having larger wettability with a mold is desirable.

Moreover, when applying on a mold using an ink-jet system, a piezo type ink-jet system which uses a piezoelectric element, or a bubble-jet mode can be used for an ink-jet system. When a piezo type ink-jet system is used, it can discharge the liquid composition having a wide range of viscosity up to about several mPa·s to 100 mPa·s, the use of a piezo type ink-jet system is desirable.

An ink-jet head is filled up with a liquid composition, and the liquid composition is discharged from nozzles to coat the required portion of the mold surface.

In the present invention, when a film is used as a mold, there is no limitation to the kinds of films in particular, it is preferable to use a plastic film. The following can be cited as usable plastic films: polyolefin films (for example, a polyethylene film and a polypropylene film), polyester films (for example, a polyethylene terephthalate film and polyethylene-2,6-naphthalate film), polyamide films (for example, polyether ketone film), polycarbonate film and a polysulfone film. Moreover, there is no limitation to the width, the physical properties and the shape of the film to be used in particular, it is possible to choose suitably in accordance with the product to be manufactured.

<Pasting a Light Transmissive Base Material (Resin Substrate B) and a Mold Together>

In the present invention, a light transmissive base material (resin substrate B) and a mold are pasted together in the sate that the resin composition is not cured. If the timing of pasting is too late, the degree of close adhesion of the light transmissive base material (resin substrate B) and the mold will not become high, and it will produce trouble that the rugged structure is peeled off from the light transmissive base material (resin substrate B) after the rugged structure is formed.

When the substrate is a sheet form, it can use an approach, such as pressing the substrate against the mold to which the resin composition has been applied with a roller so that an air bubble may not enter.

When the mold has low absorptivity and low volatility to the solvent in the liquid composition at this time, the drying speed will be increased by using the light transmissive base material (resin substrate B) having high absorptivity and high volatility to the solvent and the thickness of the film or the substrate is thinner. On the other hand, since there may produce a trouble that deformation by the solvent will arise if the thickness of the light transmissive base material (resin substrate B) is too thin, it is preferable to have a suitable thickness which enable to be compatible with these.

<Curing>

The resin composition is cure in the state that the mold to which the resin composition is applied and the light transmissive base material (resin substrate B) are pasted together, or in the state that the mold and the light transmissive base material (resin substrate B) to which the resin composition was applied) are pasted together.

Volatilization and drying of the solvent may be performed at room temperature. Moreover, in order to accelerate drying and solidification so as to shorten a takt time, it is possible to place it in a room kept at a certain constant temperature, to blow a warm air to the side of the light transmissive base material (resin substrate B) or to the side of the substrate, or to prepare a temperature increasing mechanism to the mold. However, if the temperature is increased to more than a predetermined temperature, it may produce a trouble that the film, the substrate or the liquid composition will be deformed, or an air bubble will be produced during the drying process. It is preferable to cure using a curable resin hardened by irradiation with actinic rays such as an UV light or an electron beam.

<Demolding>

Demolding of the resin composition from the mold is carried out in the stage that the resin composition is cured enough to maintain its form.

If demolding is too early, it may produce a trouble that the produced rugged structure of the resin composition will be collapsed at the time of demolding, and transfer performance will be fallen. Moreover, in order to increase the speed of the solidification to raise the takt time of the apparatus, it is preferable to demold it promptly after the time when it acquire the hardened state to a degree of not deforming the shape.

[Organic EL Element]

Preferred embodiments of the organic EL element of the present invention will be described below:

(i) anode/light emitting layer/electron transport layer/cathode (ii) anode/hole transport layer/light emitting layer/electron transport layer/cathode (iii) anode/hole transport layer/light emitting layer/hole blocking layer/electron transport layer/cathode (iv) anode/hole transport layer/light emitting layer/hole blocking layer/electron transport layer/cathode buffer layer/cathode (v) anode/anode buffer layer/hole transport layer/light emitting layer/hole blocking layer/electron transport layer/cathode buffer layer/cathode.

Here, it is preferable that the light emitting layer contains at least two or more light emitting materials which emit lights of different colors. It may be a single layer or it may form a light emitting layer unit composed of a plurality of light emitting layers. In addition, the hole transport layer includes a hole injection layer and an electron blocking layer.

[Light Emitting Layer]

The light emitting layer of the present invention is a layer, which emits light via recombination of electrons and holes injected from an electrode or a layer such as an electron transport layer or a hole transport layer. The light emission portion may be present either within the light emitting layer or at the interface between the light emitting layer and an adjacent layer thereof.

The structure of the light emitting layer of the present invention is not limited in particular as long as the contained light emitting material satisfies the above-described requirements.

Further, it may have a plurality of light emitting layers emitting the same light emitting spectrum or the same light emitting maximum wavelength.

It is preferable that a non light emitting interlayer is provided between the light emitting layers.

The total thickness of the light emitting layers is preferably in the range of 1 to 100 nm, more preferably it is 30 nm or less from the viewpoint of obtaining lower driving voltage. Here, in the present invention, the total thickness of the light emitting layers indicates the thickness including the thickness of an interlayer when a non light emitting interlayer exists between the light emitting layers.

The thickness of each of the light emitting layers is preferably adjusted in the range of 1 to 50 nm, more preferably it is adjusted in the range of 1 to 20 nm. There is no specific limitation to the thickness relationship between blue, green and red light emitting layers.

The light emitting layer may be produced by forming a film of a light emitting material or a host compound, which will be described later, via commonly known thin film forming methods such as a vacuum deposition method, a spin coat method, a casting method, a LB method and an inkjet method.

In the present invention, it may be mixed plural light emitting materials in each light emitting layer, and it may be mixed a phosphorescent emitting material and a fluorescent emitting material in the same light emitting layer.

In the present invention, it is preferable that the light emitting layer contains a host compound and a light emitting material (it is also called as a "light emitting dopant") as composing members of the light emitting layer, and a light is emitted from the light emitting material.

As a host compound contained in the light emitting layer of the organic EL element of the present invention, it is preferable that it has a phosphorescent quantum yield of the phosphorescence emission of less than 0.1 at room temperature (25° C.). More preferably, the phosphorescent quantum yield is less than 0.01. Further, among the compounds contained in the light emitting layer, a host compound is preferably contained in an amount of 50 volume % or more.

As a host compound, it may be used a known host compound singly or it may be used in combination with plural host compounds. It is possible to control the transfer of charges by making use of a plurality of host compounds, which results in high efficiency of an organic EL element. In addition, it is possible to mix a different emission lights by making use of a plurality of light emitting materials which will be described later. Any required emission color can be obtained thereby.

Further, a host compound used in the present invention may be either a low molecular weight compound or a polymer compound having a repeating unit, in addition to a low molecular weight compound provided with a polymerizing group such as a vinyl group and an epoxy group (an evaporation polymerizable emission host).

As a known host compound, it is preferable to use a compound having a hole transporting ability and an electron transporting ability, and preventing longer wavelength of emission light with having a high Tg (glass transition temperature). Here, "glass transition temperature (Tg)" is a value determined with DSC (Differential Scanning calorimetry) based on JIS-K-7121.

As specific examples of an emission host compounds, the compounds described in the following Documents are preferable. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

In the following, a light emitting material will be described.

As a light emitting material relating to the present invention, it can be used a fluorescent compound and a phosphorescent emitting material (it is called as a phosphorescent compound or a phosphorescent emitting compound).

In the present invention, the phosphorescent emitting material is a compound, wherein emission from an excited triplet state thereof is observed, specifically, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescent material are cited. One is an energy transfer-type, wherein carriers recombine on a host compound on which the carriers are transferred to produce an excited state of the host compound, and then via transfer of this energy to a phosphorescent material, emission from the phosphorescence emitting material is realized. The other is a carrier trap-type, wherein a phosphorescence emitting material serves as a carrier trap and then carriers recombine on the phosphorescent material to generate emission from the phosphorescent material. In each case, the excited state energy of the phosphorescent material is required to be lower than that of the host compound.

The phosphorescent material can be suitably elected from the known compounds used in the light emitting layer of the organic EL element. Preferably, it is a complex compound containing a metal of Group 8 to Group 10 in the periodic table of elements. More preferably, it is an iridium compound, an osmium compound, a platinum compound (a platinum complex compound), or a rare earth complex. Among them, most preferable compound is an iridium compound.

In the organic electroluminescence element of the present invention, it may be used a fluorescent emitting material. Specific examples of a fluorescent emitting material (fluorescent dopant) include: a coumarin based dye, a pyran based dye, a cyanine based dye, a croconium based dye, a squarylium based dye, an oxobenzanthracene based dye, a fluorescein based dye, a Rhodamine based dye, a pyrylium based dye, a perylene based dye, a stilbene based dye, a polythiophene based dye, and a rare earth complex based fluorescent material.

Further, conventionally known dopants can be used in the present invention. They are described in, for example: WO 00/70655 pamphlet, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645 pamphlet, JP-A Nos. 2002-332291, 2002-50484, 2002-322292 and 2002-83684, Japanese Translation of PCT International Application Publication No. 2002-540572, JP-A Nos. 2002-117978, 2002-338588, 2002-170684 and 2002-352960, WO 01/93642 pamphlet, JP-A Nos. 2002-50483, 2002-100476, 2002-173674, 2002-359082, 2002-175884, 2002-363552, 2002-184582 and 2003-7469, Japanese Translation of PCT International Application Publication No. 2002-525808, JP-A 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

In the present invention, at least one light emitting layer may contain two or more light emitting materials. The content ratio of the light emitting material may be changed in the depth direction of the light emitting layer.

<<Interlayer>>

There will be described the case in which a non light emissive interlayer (it is called as a "none doped region") is provided between the light emitting layers in the present invention.

A non light emitting interlayer is a layer formed between the light emitting layers when plural light emitting layers are contained.

The thickness of the non light emitting interlayer is preferably in the range of 1 to 20 nm, more preferably it is in the range of 3 to 10 nm from the viewpoints of reducing energy transfer between adjacent light emitting layers and avoiding to give large load to the electric current-voltage characteristic of the element.

Although the material used in this non light emitting layer may be the same as or different from the host compound in the light emitting layer, it is preferable that the material in the non light emitting layer is the same host material used in at least one of the two adjoining light emitting layers to the non light emitting layer.

The non light emissive interlayer may contain the common compound (for example, a host compound) contained in a non light emitting layer or each light emitting layer. By containing the common host compound, it can obtain the effect that the injection balance of holes and electrons is easily kept even when the voltage (electric current) is changed due to the decrease of interlayer injection bather between the light emitting layer and the non light emitting layer. Here, "to use the common host material" indicates the case in which the physicochemical property (such as phosphorescence emitting energy or glass transition temperature) is the same or the molecular structure of the host compound is the same. Moreover, by incorporating in the non doped light emitting layer the host material which has the same physical property or the same molecular structure as the host compound contained in each light emitting layer, it is possible to resolve the major problem of complication of the conventional production of the organic EL element.

When an organic EL element is used in the present invention, since a host material bears transport of a carrier, it is preferable that the host compound has carrier transport ability. Although carrier mobility is used as physical property showing carrier transport ability, it is generally observed dependency of electric field strength regarding the carrier mobility of an organic material. Since the material of high dependency of electric field strength regarding will tend to lose a balance of injection and transport of holes and electrons, it is preferable to use a material of small dependency of electric field strength for an interlayer material and a host material.

Moreover, on the other hand, in order to adjust the injection balance of holes and electrons in an optimum condition, it is cited as a preferable embodiment in which the none light emissive interlayer will function as a blocking layer later described, that is, to function as a hole blocking layer or an electron blocking layer.

[Injection Layer: Electron Injection Layer, Hole Injection Layer]

An injection layer is appropriately provided and includes an electron injection layer and a hole injection layer, which may be arranged between an anode and an emitting layer or a positive transfer layer, and between a cathode and an emitting layer or an electron transport layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a hole injection layer (an anode buffer layer) and an electron injection layer (a cathode buffer layer).

An anode buffer layer (a hole injection layer) is also detailed in such as JP-A Nos. 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polyaniline (or called as emeraldine) or polythiophene.

A cathode buffer layer (an electron injection layer) is also detailed in such as JP-A Nos. 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1 nm to 5 μm although it depends on a raw material.

[Blocking Layer: Hole Blocking Layer, Electron Blocking Layer]

A blocking layer is provided if needed in addition to the basic constitution layer structures in the organic thin layers of the present invention. Examples of such a blocking layer are hole blocking layers (hole block layers) described in JP-A Nos. 11-204258 and 11-204359 and p. 273 of "Organic EL Elements and Industrialization Front Thereof (Nov. 30 (1998), published by N. T. S Corp.)".

A hole blocking layer, in a broad meaning, is provided with a function of electron transport layer, being comprised of a material having a function of transporting an electron but a very small ability of transporting a hole, and can improve the recombination probability of an electron and a hole by blocking a hole while transporting an electron. Further, a constitution of an electron transport layer described later can be appropriately utilized as a hole blocking layer of an organic EL element according to this invention. The hole blocking layer in the organic EL element of the present invention is preferably provided adjacent to the emission layer.

Meanwhile, an electron blocking layer has a function of a hole transport layer in a broad sense. An electron blocking layer is composed a material having a property to transport a hole and, at the same time, having a very weak property to transport an electron. It is possible to improve the recombination rate of an electron and a hole by transporting a hole and blocking an electron from transporting. A structure of a hole transport layer can be used for an electron blocking layer. The layer thickness of the hole blocking layer and the electron transport layer according to the present invention is preferably from 3 to 100 nm, and is more preferably from 5 to 30 nm.

<<Hole Transport Layer>>

A hole transport layer contains a material having a function of transporting a hole, and in a broad meaning, a hole injection layer and an electron blocking layer are also included in a hole transport layer. A single layer of or plural layers of a hole transport layer may be provided.

A hole transport material is those having any one of a property to inject or transport a hole or a bather property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'- diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenykarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A No. 4-308688.

Polymer materials, in which these materials are introduced in a polymer chain or constitute the main chain of polymer, can be also utilized. Further, an inorganic compound such as a p type-Si and a p type-SiC can be utilized as a hole injection material and a hole transport material.

It can be used a so-called p type hole transport material described in JP-A No. 11-251067 and J. Huang et al., Applied Physics Letters 80 (2002), p. 139. It is preferable to use these compounds in the present invention because they enable to give an emission element with a high emitting efficiency.

This hole transport layer can be prepared by forming a thin layer made of the above-described hole transport material according to a method well known in the art such as a vacuum evaporation method, a spin coating method, a cast method, an inkjet method and a LB method. The layer thickness of a hole transport layer is not specifically limited, however, it is generally 5 nm to 5 μm, and preferably 5 to 200 nm. This hole transport layer may have a single layer structure composed of one or not less than two types of the above described materials.

Further, an impurity-doped hole transport layer exhibiting high p-characteristics may be used. Examples thereof include those described in JP-A Nos. 4-297076, 2000-196140, and 2001-102175, as well as J. Appl. Phys., 95, 5773 (2004).

In the present invention, such a hole transport layer exhibiting high p-characteristics is preferably used to produce a low-power-consuming element.

[Electron Transport Layer]

An electron transfer layer is comprised of a material having a function to transfer an electron, and an electron injection layer and a hole blocking layer are included in an electron transfer layer in a broad meaning. A single layer or plural layers of an electron transfer layer may be provided.

In the past, when a mono or plural electron transport layers are arranged in the position nearer to the cathode with respect to an emission layer, an electron transfer material (also used as a hole blocking material) in an electron transport layer is required to have a function to transport an electron injected from a cathode to an emission layer. The compounds conventionally well known in the art can be utilized by arbitrarily selection as a material thereof. Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those whose terminal is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a hole injection layer and a hole transfer layer, an inorganic semiconductor such as an n-type-Si and an n-type-SiC can be also utilized as an electron transfer material.

The electron transport layer can be prepared by forming a thin layer made of the above-described electron transport material according to a method well known in the art such as a vacuum evaporation method, a spin coating method, a cast method, a printing method such as an inkjet method, and a LB method. The layer thickness of an electron transport layer is not specifically limited; however, is generally 5 nm to 5 μm, and preferably 5 nm to 200 nm. This electron transport layer may have a single layer structure comprised of one or not less than two types of the above described materials.

An electron transport layer containing a doped impurity and having a high n-property can be used. Examples are shown in JP-A Nos. 04-297076, 10-270172, 2000-196140, 2001-102175, and J. Appl. Phys., 95, 5773 (2004).

In the present invention, it is preferable to use an electron transport layer having a high n-property for achieving an element to be driven with low electric power consumption.

<<Cathode>>

On the other hand, as a cathode according to this invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. The sheet resistance as a cathode is preferably not more than a few hundreds Ω/□ and the layer thickness is generally selected in a range of 10 nm to 5 μm and preferably of 50 nm to 200 nm. Herein, to transmit emission, either one of an anode or a cathode of an organic EL element is preferably transparent or translucent to improve the mission luminance.

Further, a transparent or a translucent cathode can be made by applying a transparent conductive material on a cathode after providing the above-described metal on the cathode in a thickness of 1 nm to 20 nm which. The transparent conductive materials are described in the section for anode. By applying these materials, it can be made an element having both an anode and a cathode provided with a property of transparent.

[Light Extraction]

It is commonly stated that the organic EL element emits light in a layer exhibiting a higher refractive index (being about 1.7 to 2.1) than that of air, whereby only about 15% to 20% of light emitted in the light emitting layer can be taken out. The reasons for the above are as follows: the light incoming to the interface (the interface between the transparent substrate and air) at angle θ which is greater than the critical angle is totally reflected, whereby no light is taken out to the exterior of the element; and the light is totally reflected between the transparent electrode or the light emitting layer and the transparent substrate so that the light is waveguided through the transparent electrode or the light emitting layer, and as a result the light escapes to the side direction of the element.

Means to increase the light extraction efficiency include, for example, a method in which ruggedness is formed on the surface of the transparent substrate so that total reflection at the interface between the transparent substrate and air is minimized (U.S. Pat. No. 4,774,435); a method in which efficiency is enhanced by allowing the substrate to exhibit light focusing properties (JP-A No. 63-314795); a method in which a reflective surface is formed on the side of the element (JP-A No. 1-220394); a method in which a flat layer exhibiting an intermediate refractive index is introduced between the substrate and the light emitting body, whereby an reflection inhibiting film is formed (JP-A No. 62-172691); a method in which a flat layer exhibiting a refractive index lower than that of the substrate is introduced between the above substrate and the light emitting body (JP-A No. 2001-202827); and a method in which a diffraction grating is arranged between any layers of the substrate, the transparent electrode layer and the light emitting layer (including between the substrate and the exterior) (JP-A No. 11-283751).

In the present invention, the above methods may be employed in combination with the organic EL element of the present invention. However, there may be suitably employed the method to introduce a flat layer exhibiting a lower refractive index than that of the substrate between the above substrate and the light emitting body, or the method to arrange a diffraction grating between any layers of the substrate, the transparent electrode layer and the light emitting layer (including between the substrate and the exterior).

By combining these methods, the present invention enables preparation of the element which exhibits higher luminance and more excellent durability.

In a case when a medium exhibiting a low refractive index is formed at a thickness greater than the wavelength of light between the transparent electrode and the transparent substrate, the lower the refractive index of the medium, the higher the efficiency of extraction of the light, emitted from the transparent electrode, to the outside.

Examples of the medium of the low refractive index layer include aerogel, porous silica, magnesium fluoride, and fluorine based polymers. Since the refractive index of the transparent substrate is commonly 1.5 to 1.7, the refractive index of the above low refractive index layer is preferably at most 1.5, and more preferably at most 1.35.

Further, the thickness of the low refractive index medium is preferably at least twice the wavelength in the medium. The reason is that when the thickness of the low refractive index medium is about light wavelength so that electromagnetic wave leaked out via evernescent enters into the substrate, effects of the low refractive index layer are reduced.

A method to introduce a diffraction grating at the interface which results in total reflection or into any of the media is characterized in that increased effects of the light extraction efficiency is high. In the above method, of light generated from the light emitting layer, the light, which is not capable of escaping to the exterior due to total reflection at the boundary between two layers, is diffracted via an introduction of the diffraction grating between any layers or within the medium (in the transparent substrate or the transparent electrode) by utilizing properties of the diffraction grating in which it is possible to change the direction of light to a specified direction differing from diffraction via so-called Bragg diffraction, such as primary diffraction or secondary diffraction, to result in the light being extracted to the outside.

It is preferable that the introduced diffraction grating exhibits a two-dimensional periodical refractive index. Since the light emitting layer randomly emits light in all directions, in a general one-dimensional diffraction grating, which exhibits a cyclic refractive index distribution only in a certain direction, only the light directed to a specified direction is diffracted whereby the light extraction efficiency is not so increased. However, by employing the refractive index of a two-dimensional distribution, the light directing to all directions is diffracted to increase the light extraction efficiency.

The location of the diffraction grating may be, as described above, between any layers or in a medium (in a transparent substrate or a transparent electrode), but a position near the organic light emitting layer when light is emitted is preferred. In such a case, the period of the diffraction grating is preferably about half to about 3 times the wavelength of the light in the medium.

With regard to the arrangement of the diffraction grating, a two-dimensionally repeating arrangement such as a square lattice shape, a triangle lattice shape, or a honeycomb shape is preferred.

<<Light Focusing Sheet>>

In the organic EL element of the present invention, it is possible to enhance luminance in a specified direction by focusing light to the specified direction such as the front direction with regard to the light emitting surface of the element, which can be achieved by processing the element to, for example, provide a microlens array structure or by combining the element with a so-called light focusing sheet on the light extracting side of the substrate.

An example of the above microlens array is that quadrangular pyramids are two-dimensionally arranged on the light extracting side of the substrate in such a manner that one side is 30 μm and the vertex angle is 90 degrees. The side is preferably 10 μm to 100 μm. In a case when the side is shorter than the above length, undesirable diffraction effects occur to result in unwanted coloration, while in a case where the side is excessively long, the thickness undesirably increases.

As the light focusing sheet, it is possible to employ, for example, those which are currently used in LED backlights of liquid crystal display devices. As an example of such a sheet, the luminance enhancing film (BEF), produced by Sumitomo 3M Co., Ltd, may be employed. As the shape of a prism sheet, examples may include a sheet in which a stripe of triangles is formed on the substrate, which stripe exhibits a vertex angle of 90 degrees and a pitch of 50 μm, or may be a sheet exhibiting shapes such as a rounded vertex, randomly varying pitches, and the like.

Further, to control the radiation angle of light from the light emitting element, a light diffusion plate/film may be combined with the focusing sheet. For example, the light diffusion film (LIGHT-UP), produced by Kimoto Co., Ltd. may be employed.

[Preparation Method of Organic EL Element]

As an example of the preparation method of the organic EL element of the present invention, a preparation method of an organic EL element composed of an anode/a hole injecting layer/a hole transporting layer/a light emitting layer/a hole blocking layer/an electron transporting layer/an electron injecting layer/a cathode is described below.

First, a thin film composed of desired electrode materials, such as anode materials, is formed on a suitable substrate via a vapor deposition or sputtering method to at most 1 μm, preferably 10 to 200 nm in a film thickness to prepare an anode. Subsequently, on the above anode, thin films of organic compounds composed of a hole injecting layer, a hole transporting layer, a light emitting layer, a hole blocking layer and an electron transporting layer, all of which are materials for the organic EL element, are formed.

Forming methods of each of the above organic compound thin layers include, as described above, a vapor-deposition method and wet processes (such as a spin coating method, a cast method, an ink-jet method, and a printing method). In the present invention, film formation by a vapor-deposition method, a spin coating method, an ink-jet method and a printing method are especially preferred from viewpoints that a homogeneous film is readily formed and a pin hole is hard to be formed. It may used different film forming method for each layer. When a vapor-deposition method is adopted, the condition of vapor-deposition is different depending on the materials used. Generally, it is preferable to select the conditions from the following ranges: the heating temperature of the boat is from 50 to 450° C., the vacuum degree is from $10^{-6}$ to $10^{-2}$ Pa, the vapor-deposition rate is from 0.01 to 50 nm/second, the temperature of the substrate is from −50 to 300° C., the layer thickness is from 0.1 nm to 5 μm, more preferably from 5 to 200 nm.

After formation of these layers, a thin film comprising a cathode material is formed thereon to 1 μm or less, preferably in a range of 50 to 200 nm in film thickness by means of such as a vapor-deposition or sputtering to provide a cathode, whereby a desired organic EL element can be prepared. Although it is preferable that the preparation of the organic El element is carried out from a hole injection layer to a cathode with one vacuum condition, it may be take out during the preparation, and a different film preparation method can be applied. In that case, consideration of working under a dry inert gas atmosphere is needed.

Further, the above preparation order may be reversed, and preparation may be conducted in the order of the cathode, the electron injecting layer, the electron transporting layer, the light emitting layer, the hole transport layer, the hole injecting layer, and the anode. In a case when direct current voltage is applied to the multicolor display device prepared as above, light emission can be observed when a voltage of 2 to 40 V is applied while the anode is set to a positive polarity and the cathode is set to a negative polarity. Further, alternating current voltage may be applied, of which any waveforms of the applied alternating current may be employed.

[Applications]

The surface light emitting member and the light emitting panel relating to the present invention may be utilized as a display device, a display, or various light sources. Examples of the use of the light source include a lamp for home use or a room lamp in a car, a backlight for a watch or a liquid crystal, a light source for boarding advertisement, a signal device, a light source for a photo memory medium, a light source for an electrophotographic copier, a light source for an optical communication instrument and a light source for an optical sensor, but are not limited to them. Of these, the element is particularly effectively utilized for a backlight for a liquid crystal display combined with a color filter or a light source for lighting use.

[Lighting Device]

An organic EL element material of the present invention can be also applied to an organic EL element to generate emission of practically white color as a lighting device. Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained Further, a combination of emission materials to obtain plural number of emission colors may be either a combination comprising plural number of materials which emit phosphoresce or fluorescence (light emitting dopants), or a combination of a material which emits phosphoresce or fluorescence and a dye material which emits by light from an emission material as exiting light, however, in a white organic EL element according to the present invention, it is preferable to mix plural light emitting dopants in combination.

As layer compositions of the organic EL element to obtain plural color of emitting lights, there are cited the following methods: a method to contain plural light emitting dopants in one light emitting layer; a method to have plural light emitting layers each containing a dopant emitting a light having a different wavelength; and a method to form micro pixels which emit a light having a different wavelength.

The white organic EL element of the present invention, if desired, may be subjected to patterning during film making, via a metal mask or an ink-jet printing method. In a case of the patterning, only the electrode may be subjected to the patterning, or both the electrode and the light emitting layer may be subjected to the patterning, or all element layers may be subjected to the patterning.

An emission material utilized in an emission layer is not specifically limited, and in the case of a backlight of a liquid crystal display element, any combination by arbitrary selection among platinum complexes according to the present invention or emission materials well known in the art can be utilized so as to be fitted to the wavelength range corresponding to CF (color filter) characteristics, whereby white emission can be obtained.

As described above, the white organic EL element can be used as a display device and a display. In addition to these, it can be effectively used as various light sources for illumination including a lamp for home use or a room lamp in a car; for a kind of lamp for an exposure light source; and for a display device as a backlight in a liquid display device.

Moreover, it can be used for a wide range of applications such as: a backlight for a clock; a light source for advertising display, signal, and optical memory medium; a light source for electrophotographic copier, optical communication processor, and optical sensor; and general home electronic apparatuses requiring a display device.

EXAMPLES

The present invention will now be described with reference to examples, however the present invention is not limited thereto.

<Preparation of Polycarbonate Film Mold 1>

By using a positive type resist which is removed the resist of a light exposure part, this resist was coated on a quartz glass substrate (1.2 mm in thickness, 70 mm square) with a spin coat method. Subsequently, mold formation by laser interference exposure was performed. First, the detailed pattern was drawn to the resist using a liquid immersion exposing optical system. A UV laser (wave length of 266 nm) was used for the liquid immersion exposing optical system, and two light beams were irradiated with an inclination angle of 15 degree with respect to a normal direction of a quartz glass substrate to form the 1st interference fringes on the resist, and the 1st light exposure was performed. "MBD266" (made by Coherent Co., Ltd." was used as a laser light source. Next, the quartz glass substrate was rotated 90 degrees, and the 2nd light exposure was performed to form the 2nd interference fringes which intersect perpendicularly with the 1st interference fringes. And it was developed so that only the portion where the bright parts of the interference fringes of the 1st and the 2nd light exposure intersected might remain. By the above process, the resist was provided with holes regularly arranged on the quartz glass substrate, the holes being formed by reversing the convex part of the truncated pyramid shape having an apex angle θ of 50°, the height of 24 μm and a pitch of 30 μm of the convex part. The minute hole structure (having a pitch of 30 μm, and a height of 24 μm) with a drawing size of 50 mm square was formed on the quartz glass substrate using a dry etching method. By using this as a mother die, a mold having a plurality of projections (pillars) of truncated pyramid shape with a pitch 30 μm and a height of 24 μm located regularly was prepared by nickel electroforming. By employing this mold with a thermal imprint method, it was obtained a polycarbonate film mold 1 having a surface structure which has holes with a reversed shape of a convex form of a truncated pyramid having a pitch of 30 μm and a depth of 24 μm arranged in a two dimension. Then, the following demolding process was performed to the produced polycarbonate film mold 1.

(Demolding Process of Polycarbonate Film Mold)

The above-described polycarbonate film mold was subjected to surface treatment with a silane coupling agent containing a chloro fluorinated resin, tridecafluoro-1,1,2,2-tetrahydrooctyl trichlorosilane ($CF_3$—$(CF_2)_5$—$CH_2$—$CH_2SiCl_3$) to form a chemical adsorption film made of a fluororesin on the surface of a minute shape.

<Preparation of a Resin Composition for a Hard Coat>

(Preparation of Zirconia Particles)

To a zirconium salt solution prepared by dissolving 2,600 g of zirconium oxychloride 8 hydrate salt in 40 L of pure water was added with stirring a diluted aqueous ammonia solution prepared by 340 g of 28% aqueous ammonia solution dissolved in 20 L of pure water. Thus a zirconia precursor slurry was prepared.

Subsequently, to this zirconia precursor slurry was added with stirring a sodium sulfate aqueous solution prepared by dissolving 400 g of sodium sulfate in 5 L of pure water.

Next, this mixture was dried at 120° C. in the air for 24 hours using an oven, and the solid matter was obtained.

Subsequently, after grinding this solid matter with an automatic mortar, it was calcined at 500° C. in the air for 1 hour using an electric furnace. This calcined material was thrown in pure water, and it was made into a slurry by stirring. Then, it was washed using a centrifuge, followed by fully removing the added sodium sulfate. Thereafter, it was dried with an oven and zirconia particles 1 were prepared. The average particle diameter was 4 nm as a result of TEM observation. It was confirmed from XRD that particles are $ZrO_2$ crystals.

Moreover, zirconia particles having a different particle diameter as shown in Table 1 were prepared by suitably changing a concentration of a zirconium salt solution.

(Surface Treatment to Zirconia Particles)

To 100 ml of toluene containing 2 g of phenyltrimethoxsilane (made by Shin-Etsu Chemical Co., Ltd.) and 0.1 g of methaciyloxypropyltrimethoxysilane was added 10 g of the above-described zirconia particles. The mixture was dispersed under nitrogen with zirconia particles of 0.03 mm size and it was heated up to 100° C. to obtain a uniform dispersion liquid. The heat reflux was carried out under nitrogen for 5 hours, and a toluene dispersion liquid of surface treated zirconia particles was obtained.

(Preparation of Titania Particles)

To a cooled water (about 4° C.) was added $TiCl_4$ and it was hydrolyzed, followed by kept in a hermetic container for five days. Water was removed with a rotary evaporator, and distilled water was further added, and this operation was repeated. The same operation was made using methanol instead of using distilled water and dried powders were obtained.

After grinding the obtained dried powders with an automatic mortar, they were calcined at 500° C. in the air for 1 hour using an electric furnace. This calcined material was thrown in pure water, and it was made into a slurry by stirring. Then, it was washed using a centrifuge, followed by drying to obtain titania particles 1. The average particle diameter was 10 nm as a result of TEM observation. It was confirmed from XRD that particles are ruffle type $TiO_2$ crystals.

Moreover, titania particles having a different particle diameter as shown in Table 1 were prepared by suitably changing the temperature during the hydrolysis of $TiCl_4$.

Further, in the same manner as done for zirconia particles, titania particles were subjected to a surface treatment, and toluene dispersion liquids of various titania particles were obtained.

(Particle Dispersion into a Resin)

A curable resin monomer (fluorene acrylate) and the above-described surface treated zirconia dispersion liquid (with an amount to achieve a required refractive index) were mixed to become the content of zirconia of 35 vol %, and further, was added a polymerization initiator and it was dissolved.

<<Preparation of Light Transmissive Base Material 101>>

<Formation of a Hard Coat Layer (H1) on a Light Transmissive Resin Substrate (Resin Substrate B)>

As a light transmissive resin substrate (resin substrate B), it was used biaxially stretched PEN (made by Teijin Du Pont Films Co.; refractive index of 1.75) having a thickness of 125 μm. On one surface of this film was coated with the above-mentioned resin composition for a hard coat layer so that the coating thickness after dry hardening might be set to 20 μm, and it was irradiated and hardened with a UV light to obtain the resin substrate B provided with a hard coat layer (H1) on one surface thereof.

<Formation of a Hard Coat Layer (H2) on a Light Transmissive Resin Substrate (Resin Substrate B)>

To the above-mentioned polycarbonate film mold 1 was loaded and coated with the above-mentioned resin composition for a hard coat layer. And the resin composition for a hard coat layer with which was performed loading and coating to the polycarbonate film mold 1 was closely stuck to another surface of the resin substrate B which has been formed with the hard coat layer (H1) to paste them together. Subsequently, under the state of pasting together, a UV light was irradiated to cure, and then, the polycarbonate film mold 1 was demolded. It was formed by transfer a hard coat layer (H2)

having a rugged structure on the resin substrate B. When observed with a scanning type electron microscope, it was found as follows: the convex part was a truncated pyramid shape having an apex angle θ of 50°, the height of 24 μm and a pitch of 30 μm of the convex part, and the coating thickness of the hard coat layer (H2) except the convex part was 20 μm, and the convex part occupied 80% of the surface area of the hard coat layer (H2). Furthermore, the uniformity in the pitch and the uniformity in the height were both excellent.

The refractive index of the hard coat layer (H1) and the hard coat layer (H2) was respectively 1.85. The prepared product was named as Light transmissive base material 101.

<<Preparation of Light Transmissive Base Materials 102 to 123>>

Light transmissive base materials 102 to 123 each were prepared in the same manner as preparation of light transmissive base materials 101 except that an added amount of $ZrO_2$ or $TiO_2$ (an amount to achieve a required refractive index), an average particle diameter of $ZrO_2$ or $TiO_2$, and a thickness of the hard coat layer were changed as described in Table 1. In addition, the resin substrate B having no hard coat layer was named as light transmissive base material 123.

<<Evaluation of Light Transmissive Base Materials>>

[Evaluation of Anti-Scratching Property]

The prepared light transmissive base materials 102 to 123 each were rubbed 20 times of go and return with a steel wool having a size of 2 cm×2 cm loaded with 500 g of weight. The number of scratch lines produced per 1 cm width was counted with visual inspection. The obtained results are shown in Table 1.

6: No production of scratch line
5: Production of about 10 scratch lines
4: Production of about 10 scratch lines
3: Production of about 30 scratch lines
2: Production of about 50 scratch lines
1: Production of an infinite number of scratch lines From the results shown in Table 1, it was found that Light transmissive base materials 101 to 110 and 112 to 120, which are used in an organic electroluminescence relating to the present invention, were excellent in Anti-scratching property compared with light transmissive base materials 111 and 122 to 123. In addition, light transmissive base materials 101 to 110 and 112 to 120 each had a pencil hardness based on JIS K 5600-5-4 within the range from 2H to 4H.

Example 2

Preparation of Organic EL Element 201

On the side of light transmissive base materials 101 provided with a hard coat layer (HD, which was prepared in Example 1, ITO (indium tin oxide having a refractive index of 1.85) film was formed, then performing a patterning to this substrate. Thereafter, the substrate provided with an ITO transparent electrode was subjected to ultrasonic washing with isopropyl alcohol, followed by drying with desiccated nitrogen gas, and was subjected to UV ozone washing for 5 minutes. On this substrate was applied a 70% solution of poly(3,4-ethylenedioxythiphene)-polystyrene sulfonate (PEDOT/PSS, Baytron P AI 4083 made by Bayer AG.) diluted with water by using a spin coating method at 3,000 rpm for 30 seconds to form a film, and then, the substrate was dried at a surface temperature of 200° C. for one hour. Thus a hole injection layer having a thickness of 30 nm was prepared.

Then, this substrate was transferred under a nitrogen gas in a glove-box controlled to have a cleanness degree of class 100 measured based on JIS B 9920, a dew point of −80° C. or less, and a density of oxygen of 0.8 ppm. In the glove-box, the following coating solution for a hole transport layer was prepared. It was applied to the substrate under the condition of 1,500 rpm for 30 seconds by using a spin coater. This substrate was dried at a surface temperature of 150° C. for 30

TABLE 1

| Light transmissive base material No. | Metal oxide nano particles Metal oxide | Average particle diameter of nano particles (nm) | Added amount of metal oxide nano particles (vol %) Hard coat layer (H1) | Hard coat layer (H2) | Refractive index of hard coat layer n(H1) | n(H2) | Anti-scratching property |
|---|---|---|---|---|---|---|---|
| 101 | $ZrO_2$ | 4 | 35 | 35 | 1.85 | 1.85 | 6 |
| 102 | $ZrO_2$ | 4 | 25 | 25 | 1.75 | 1.75 | 6 |
| 103 | $ZrO_2$ | 4 | 35 | 25 | 1.85 | 1.75 | 6 |
| 104 | $ZrO_2$ | 4 | 25 | 15 | 1.75 | 1.70 | 5 |
| 105 | $ZrO_2$ | 4 | 15 | 15 | 1.70 | 1.70 | 5 |
| 106 | $ZrO_2$ | 4 | 10 | 10 | 1.63 | 1.63 | 4 |
| 107 | $ZrO_2$ | 30 | 15 | 15 | 1.70 | 1.70 | 5 |
| 108 | $ZrO_2$ | 50 | 15 | 15 | 1.70 | 1.70 | 5 |
| 109 | $ZrO_2$ | 80 | 15 | 15 | 1.70 | 1.70 | 5 |
| 110 | $ZrO_2$ | 150 | 15 | 15 | 1.70 | 1.70 | 5 |
| 111 | $ZrO_2$ | 600 | 10 | 10 | 1.70 | 1.70 | 3 |
| 112 | $TiO_2$ | 10 | 30 | 30 | 1.85 | 1.85 | 6 |
| 113 | $TiO_2$ | 10 | 20 | 20 | 1.75 | 1.75 | 5 |
| 114 | $TiO_2$ | 10 | 30 | 20 | 1.85 | 1.75 | 5 |
| 115 | $TiO_2$ | 10 | 20 | 10 | 1.75 | 1.70 | 4 |
| 116 | $TiO_2$ | 10 | 10 | 10 | 1.70 | 1.70 | 4 |
| 117 | $TiO_2$ | 30 | 10 | 10 | 1.70 | 1.70 | 4 |
| 118 | $TiO_2$ | 50 | 10 | 10 | 1.70 | 1.70 | 5 |
| 119 | $TiO_2$ | 80 | 10 | 10 | 1.70 | 1.70 | 4 |
| 120 | $TiO_2$ | 150 | 10 | 10 | 1.70 | 1.70 | 4 |
| 121 | $TiO_2$ | 600 | 10 | 10 | 1.70 | 1.70 | 3 |
| 122 | — | — | 0 | 0 | 1.60 | 1.60 | 2 |
| 123 | — | — | — | — | — | — | 1 | minutes to form a hole transport layer. Another coating was done with the same condition to the substrate prepared separately, and the thickness of the layer was measured. It was found to be 20 nm.

(Coating Solution for a Hole Transport Layer)

| Monochlorobenzene | 100 g |
|---|---|
| Poly-N,N'-bis(4-butylphenyl)-N,N'-bis(phenyl)benzidine (ADS-254, produced by American Dye Source, Co., Ltd.) | 0.5 g |

Subsequently, the following coating solution for a light emitting layer was prepared, and it was applied under the condition of 2,000 rpm for 30 seconds with a spin coater. This substrate was dried at a surface temperature of 120° C. for 30 minutes to form a light emitting layer. Another coating was done with the same condition to the substrate prepared separately, and the thickness of the layer was measured. It was found to be 40 nm. Among the following light emitting layer composition, the element showing the lowest Tg was H-A, and it was 132° C.

(Coating Solution for a Light Emitting Layer)

| Butyl acetate | 100 g |
|---|---|
| H-A | 1 g |
| D-A | 0.11 g |
| D-B | 0.002 g |
| D-C | 0.002 g |

Subsequently, the following coating solution for an electron transport layer was prepared, and it was applied under the condition of 1,500 rpm for 30 seconds with a spin coater. This substrate was dried at a surface temperature of 120° C. for 30 minutes to form an electron transport layer. Another coating was done with the same condition to the substrate prepared separately, and the thickness of the layer was measured. It was found to be 30 nm.

(Coating Solution for an Electron Transport Layer)

| 2,2,3-Tetrafluoro-1-propanol | 100 g |
|---|---|
| ET-A | 0.75 g |

Subsequently, the substrate having been prepared until the electron transport layer was transferred into an vacuum deposition apparatus without exposing to the air, then the vacuum chamber was reduced to $4 \times 10^{-4}$ Pa. Here, potassium fluoride and aluminium each have been placed in a resistive heating boat made of tantalum in the vacuum deposition apparatus.

First, the resistive heating boat containing potassium fluoride was electrified to heat, to result in preparing an electron injection layer have of potassium fluoride having a thickness of 3 nm on the substrate. Subsequently, the resistive heating boat containing aluminium was electrified to heat, to result in preparing a cathode made of aluminium having a thickness of 100 nm at a vacuum deposition rate of 1 to 2 nm/second.

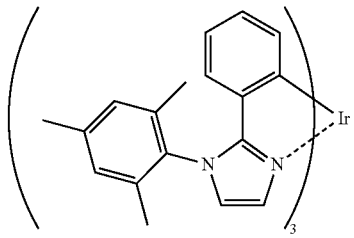

D-A

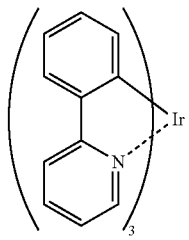

D-B

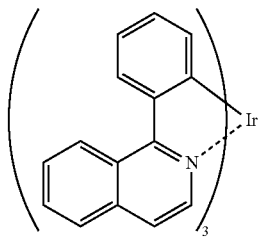

D-C

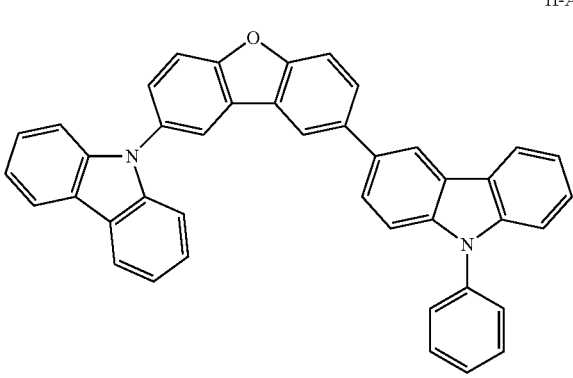

H-A

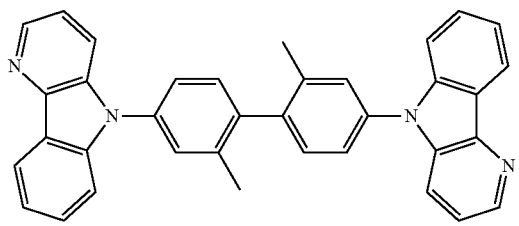

ET-A

Subsequently, sealing was carried out. The element having been prepared until the cathode was transferred without being exposed to the air into a glove-box controlled to have a cleanness degree of class 100 measured based on JIS B 9920, a dew point of −80° C. or less, and a density of oxygen of 0.8 ppm.

In the glove-box, a sealing member composed of a aluminium foil having a thickness of 100 μm provided with a heat curable liquid adhesive (an epoxy based resin) having a thickness of 30 μm on one surface of the aluminium foil was used for sealing. This sealing member was laminated on the organic layer surface of the element in such a manner that the edge of the taking-out of the first electrode and the second electrode of the element each were exposed to the outside. The adhesion was done with a dry laminate method. Thus Organic EL element 201 was obtained.

<<Preparation of Organic EL Elements 202 to 223>>

Organic EL elements 202 to 223 each were prepared in the same manner as preparation of Organic EL element 201, except that the light transmissive base material was replaced with the substrates 102 to 123 as shown in Table 2.

3: Luminescence brightness is further unstable with appearance of about 7 to 8 pieces of shining points and black points.

2: Luminescence brightness is much further unstable with appearance of over 10 pieces of shining points and black points.

1: Luminescence is not observable.

The obtained results were listed in Table 2.

TABLE 2

| Organic EL element No. | Light transmissive base material No. | Refractive index ITO, n(A) | Refractive index Resin substrate B, n(B) | Refractive index of Hard coat layer n(H1) | Refractive index of Hard coat layer n(H2) | Quantum Efficiency of Light Extraction | Bending resistance | Remarks |
|---|---|---|---|---|---|---|---|---|
| 201 | 101 | 1.85 | 1.75 | 1.85 | 1.85 | 100 | 6 | Invention |
| 202 | 102 | 1.85 | 1.75 | 1.75 | 1.75 | 116 | 6 | Invention |
| 203 | 103 | 1.85 | 1.75 | 1.85 | 1.75 | 103 | 6 | Invention |
| 204 | 104 | 1.85 | 1.75 | 1.75 | 1.70 | 110 | 6 | Invention |
| 205 | 105 | 1.85 | 1.75 | 1.70 | 1.70 | 97 | 5 | Invention |
| 206 | 106 | 1.85 | 1.75 | 1.63 | 1.63 | 85 | 5 | Invention |
| 207 | 107 | 1.85 | 1.75 | 1.70 | 1.70 | 95 | 5 | Invention |
| 208 | 108 | 1.85 | 1.75 | 1.70 | 1.70 | 94 | 5 | Invention |
| 209 | 109 | 1.85 | 1.75 | 1.70 | 1.70 | 92 | 4 | Invention |
| 210 | 110 | 1.85 | 1.75 | 1.70 | 1.70 | 88 | 3 | Invention |
| 211 | 111 | 1.85 | 1.75 | 1.70 | 1.70 | 75 | 2 | Comparison |
| 212 | 112 | 1.85 | 1.75 | 1.85 | 1.85 | 101 | 6 | Invention |
| 213 | 113 | 1.85 | 1.75 | 1.75 | 1.75 | 115 | 6 | Invention |
| 214 | 114 | 1.85 | 1.75 | 1.85 | 1.75 | 103 | 5 | Invention |
| 215 | 115 | 1.85 | 1.75 | 1.75 | 1.70 | 110 | 6 | Invention |
| 216 | 116 | 1.85 | 1.75 | 1.70 | 1.70 | 98 | 5 | Invention |
| 217 | 117 | 1.85 | 1.75 | 1.70 | 1.70 | 95 | 4 | Invention |
| 218 | 118 | 1.85 | 1.75 | 1.70 | 1.70 | 94 | 4 | Invention |
| 219 | 119 | 1.85 | 1.75 | 1.70 | 1.70 | 92 | 4 | Invention |
| 220 | 120 | 1.85 | 1.75 | 1.70 | 1.70 | 88 | 3 | Invention |
| 221 | 121 | 1.85 | 1.75 | 1.70 | 1.70 | 75 | 2 | Comparison |
| 222 | 122 | 1.85 | 1.75 | 1.60 | 1.60 | 73 | 1 | Comparison |
| 223 | 123 | 1.85 | 1.75 | — | — | 66 | 1 | Comparison |

<<Evaluation of Organic El Elements>>

[Quantum Efficiency of Light Extraction to the Outside]

The quantum efficiencies of light extraction to the outside (%) of the thus prepared organic El elements were determined by applying a constant electric current of 2.5 mA/cm$^2$. The determination was carried out by employing a spectroradiometer CS-1000 (manufactured by Konica Minolta Sensing Inc.). The obtained results of the quantum efficiency of light extraction to the outside are expressed as the relative values when the value of Organic EL element 101 is designated as 100.

[Bending Resistance]

The light emitting portion of the produced organic EL element was bended so that the light emitting surface came inside with a bending diameter of 2 cm. The movement of bending and stretching were repeated 50 times under an inert gas atmosphere. The luminescent state before and after carrying out bending and stretching was observed visually, and the following rank was allocated. The obtained results are shown in Table 2.

6: Uniform luminescence is obtained without any shining points and any black points.

5: Stable luminescence is obtained in spite of appearance of one or two pieces of shining points and black points.

4: Luminescence brightness is slightly unstable with appearance of about 5 pieces of shining points and black points.

From the results shown in Table 2, it was found that Organic EL elements 201 to 210 and 212 to 220 relating to the present invention were excellent in quantum efficiency of light extraction and bending resistance compared with comparison samples 211 and 221 to 223. In addition, when it was observed the cross-section of the part where the shining point and the black point were observed, there was produced layer peeling-off at the interface of a hard coat layer and ITO. This peeling-off was correlated with the results of bending resistance.

Example 3

Preparation of Polycarbonate Film Molds 2, 3, 4 and 5

In the same manner as preparation of Polycarbonate film mold 1, it was prepared a mold having a plurality of projections (pillars) of truncated pyramid shape having an apex angle θ of 63°, a pitch of 25 μm and a height of 15 μm of the convex part. By employing this mold with a thermal imprint method, it was obtained a polycarbonate film mold 2 having a surface structure which has holes with a reversed shape of a convex form of the truncated pyramid having a pitch of 25 μm and a depth of 15 μm arranged in a two dimension.

Further, in the same manner as preparation of Polycarbonate film mold 2, the pitch of the convex part was adjusted isotropically within the mold so that the convex part occupied 90%, 95%, and 100% of the surface area to obtain Polycarbonate film molds 3, 4 and 5.

<<Preparation of Light Transmissive Base Material 301>>
<Formation of a Hard Coat Layer (H1) on a Light Transmissive Resin Substrate (Resin Substrate B)>

Formation of a hard coat layer (H1) on a light transmissive resin substrate (resin substrate B) was done in the same manner as done for the above-described light transmissive base material 201.

the hard coat layer (H1). Further, the light transmissive base material 123 having no hard cat layer was also prepared.

Organic EL elements 401 to 406 each were prepared in the same manner as preparation of Organic EL element 201 except that the light transmissive base material employed was replaced with the substrates 301 to 305 and 123, respectively.

Quantum efficiency of light extraction and bending resistance of the samples were evaluated in the same manner as in Example 2.

The obtained results were listed in Table 3.

TABLE 3

| Organic EL element No. | Light transmissive substrate No. | Refractive index ITO, n(A) | Refractive index Resin substrate B, n(B) | Refractive index of Hard coat layer n(H1) | Refractive index of Hard coat layer n(H2) | Occupied ratio of the convex part on the surface of the hard coat layer (H2) (%) | Quantum Efficiency of Light Extraction | Bending resistance | Remarks |
|---|---|---|---|---|---|---|---|---|---|
| 401 | 301 | 1.85 | 1.75 | 1.75 | 1.75 | 74 | 100 | 6 | Invention |
| 402 | 302 | 1.85 | 1.75 | 1.75 | 1.75 | 90 | 111 | 6 | Invention |
| 403 | 303 | 1.85 | 1.75 | 1.75 | 1.75 | 95 | 117 | 6 | Invention |
| 404 | 304 | 1.85 | 1.75 | 1.75 | 1.75 | 100 | 123 | 6 | Invention |
| 405 | 305 | 1.85 | 1.75 | 1.75 | 1.75 | 0 | 77 | 6 | Comparison |
| 406 | 123 | 1.85 | 1.75 | — | — | — | 55 | 1 | Comparison |

<Formation of a Hard Coat Layer (H2) on a Light Transmissive Resin Substrate (Resin Substrate B)>

Another surface of the light transmissive base material (resin substrate B) which has been formed with the hard coat layer (H1) was coated with the above-described coating composition for a hard coat layer. Onto this coating layer was closely adhered the aforesaid polycarbonate film mold 2 to past them together. Subsequently, under the state of pasting together, a UV light was irradiated to cure, and then, the polycarbonate film mold 2 was demolded. It was formed by transfer a hard coat layer (H2) having a rugged structure on the resin substrate B. When observed with a scanning type electron microscope, it was found as follows: the convex part was a truncated pyramid shape having an apex angle θ of 63°, the height of 15 μm and a pitch of 25 μm of the convex part, and the coating thickness of the hard coat layer (H2) except the convex part was 20 μm, and the convex part occupied 74% of the surface area of the hard coat layer (H2). Furthermore, the uniformity in the pitch and the uniformity in the height were both excellent.

The refractive index of the hard coat layer (H1) and that of the hard coat layer (H2) was respectively 1.75. The prepared product was named as Light transmissive base material 301.

<<Preparation of Light Transmissive Base Materials 302 to 305>>

Light transmissive base materials 302 to 304 each were prepared in the same manner as preparation of light transmissive base materials 301 except that the polycarbonate film mold 2 was replaced with the polycarbonate film molds 3, 4 and 5, respectively. The occupied ratios of the convex part in the surface of the hard coat layer (H2) were, respectively, 90%, 95% and 100%. Moreover, light transmissive base materials 305 was prepared in the same manner as preparation of light transmissive base materials 301, without using a polycarbonate film mold, and another surface of the light transmissive base material (resin substrate B) which has been formed with the hard coat layer (H1) was provided with a hard coat layer (H2) prepared in the same manner as preparation of From the results shown in Table 3, it was found that Organic EL elements 401 to 404 relating to the present invention were excellent both in quantum efficiency of light extraction and bending resistance compared with comparison samples 405 and 406. In addition, two pieces of each organic electroluminescence element were superimposed so that the hard coat layer (H2) and the sealing member were contacted. After they were loaded with 300 g/cm² at 40° C. for 10 days, peeling-off test was conducted using a blocking tester. It was found that all of Organic EL elements 401 to 404 concerning the present invention were excellent in anti-blocking property.

Example 4

Preparation of Polycarbonate Film Molds 6, 7, and 8

In the same manner as preparation of Polycarbonate film mold 1, it was prepared a mold having a plurality of projections (pillars) of a triangular pyramid shape with a round tip having an apex angle θ of 58°, a pitch of 20 μm and a height of 18 μm of the convex part. By employing this mold with a thermal imprint method, it was obtained a polycarbonate film mold 6 having a surface structure which has holes with a reversed shape of a convex form of the triangular pyramid shape with a round tip having a pitch of 20 μm and a depth of 18 μm arranged in a two dimension. Further, there were prepared a mold having a plurality of projections (pillars) of a triangular pyramid shape with a round tip having an apex angle θ of 58°, a pitch of 0.1 μm and a height of 0.09 μm of the convex part; and a mold having a plurality of projections (pillars) of a triangular pyramid shape with a round tip having an apex angle θ of 58°, a pitch of 200 μm and a height of 180 μm of the convex part. By employing these molds, there were obtained a polycarbonate film mold 7 having a surface structure which has holes with a reversed shape of a convex form of the triangular pyramid shape with a round tip having a pitch of 0.1 μm and a depth of 0.09 μm arranged in a two dimension;

and a polycarbonate film mold 8 having a surface structure which has holes with a reversed shape of a convex form of the triangular pyramid shape with a round tip having a pitch of 200 μm and a depth of 180 μm arranged in a two dimension.

<<Preparation of Light Transmissive Base Material 501>>
<Formation of a Hard Coat Layer (H1) on a Light Transmissive Resin Substrate (Resin Substrate B)>

Formation of a hard coat layer (H1) on a light transmissive resin substrate (resin substrate B) was done in the same manner as done for the above-described light transmissive base material 103.

<Formation of a Hard Coat Layer (H2) on a Light Transmissive Resin Substrate (Resin Substrate B)>

Another surface of the resin substrate B which has been formed with the hard coat layer (H1) was coated with the above-described coating composition for a hard coat layer. Onto this coating layer was closely adhered the aforesaid polycarbonate film mold 6 to past them together. Subsequently, under the state of pasting together, a UV light was irradiated to cure, and then, the polycarbonate film mold 6 was demolded. It was formed by transfer a hard coat layer (H2) having a rugged structure on the resin substrate B. When observed with a scanning type electron microscope, it was found as follows: the convex part was a triangular pyramid shape with a round tip having an apex angle θ of 58°, a pitch of 20 μm and a height of 18 μm of the convex part; and the coating thickness of the hard coat layer (H2) except the convex part was 20 μm, and the convex part occupied 78.5% of the surface area of the hard coat layer (H2). Furthermore, both of them are excellent in uniformity of the pitch and the height.

The refractive index of the hard coat layer (H1) was 1.85 and the hard coat layer (H2) was 1.75. The prepared product was named as Light transmissive base material 501.

<<Preparation of Light Transmissive Base Materials 502 and 503>>

Light transmissive base materials 502 and 503 each were prepared in the same manner as preparation of light transmissive base materials 501 except that the polycarbonate film mold 6 was replaced with the polycarbonate film molds 7 and 8, respectively. Light transmissive base materials 502 has a structure of a triangular pyramid shape with a round tip having an apex angle θ of 58°, a pitch of 0.1 μl and a height of 0.09 μl of the convex part; and the coating thickness of the hard coat layer (H2) except the convex part was 20 nm, and the convex part occupied 78.5% of the surface area of the hard coat layer (H2). Light transmissive base materials 503 has a structure of a triangular pyramid shape with a round tip having an apex angle θ of 58°, a pitch of 200 μl and a height of 180 μl of the convex part; and the coating thickness of the hard coat layer (H2) except the convex part was 20 nm, and the convex part occupied 78.5% of the surface area of the hard coat layer (H2). Both of them are excellent in uniformity of the pitch and the height. Further, the light transmissive base material 123 having no hard cat layer was also prepared.

Organic EL elements 601 to 604 each were prepared in the same manner as preparation of Organic EL element 201 in Example 2 except that the light transmissive base material employed was replaced with the substrates 501 to 503 and 123, respectively.

Quantum efficiency of light extraction and bending resistance of the samples were evaluated in the same manner as in Example 2.

The obtained results were listed in Table 4.

TABLE 4

| Organic EL element No. | Light transmissive substrate No. | Refractive index ITO, n(A) | Refractive index Resin substrate B, n(B) | Refractive index of Hard coat layer n(H1) | Refractive index of Hard coat layer n(H2) | Pitch of the convex part (μm) | Height of the convex part (μm) | Quantum Efficiency of Light Extraction | Bending resistance | Remarks |
|---|---|---|---|---|---|---|---|---|---|---|
| 601 | 501 | 1.85 | 1.75 | 1.85 | 1.75 | 20 | 18 | 100 | 6 | Invention |
| 602 | 502 | 1.85 | 1.75 | 1.85 | 1.75 | 0.1 | 0.09 | 71 | 6 | Invention |
| 603 | 503 | 1.85 | 1.75 | 1.85 | 1.75 | 200 | 180 | 67 | 6 | Invention |
| 604 | 123 | 1.85 | 1.75 | — | — | — | — | 51 | 1 | Comparison |

From the results shown in Table 4, it was found that Organic EL elements 601 to 603 relating to the present invention were excellent both in quantum efficiency of light extraction and bending resistance compared with comparison sample 604. And Organic EL elements 601 was found to be the best in quantum efficiency of light extraction.

Example 5

Preparation of Polycarbonate Film Molds 9 to 15

In the same manner as preparation of Polycarbonate film mold 1, it was prepared a mold having a plurality of hemisphere shapes having a diameter of 0.3 μm arranged to have a pitch of 0.3 μm. By employing this mold with a thermal imprint method, it was obtained a polycarbonate film mold 9 having a surface structure which has holes with a reversed shape of the hemisphere shape having a pitch of 0.3 μm and a depth of 0.15 μm arranged in a two dimension. Further, there were prepared molds by changing the diameter and the pitch of the hemisphere of the mold. There were obtained the following: a polycarbonate film mold 10 having a surface structure which has holes with a reversed shape of the hemisphere shape having a pitch of 4 μm and a depth of 2 μm arranged in a two dimension; a polycarbonate film mold 11 having a surface structure which has holes with a reversed shape of the hemisphere shape having a pitch of 9 μm and a depth of 4.5 μm arranged in a two dimension; a polycarbonate film mold 12 having a surface structure which has holes with a reversed shape of the hemisphere shape having a pitch of 20 μm and a depth of 10 μm arranged in a two dimension; a polycarbonate film mold 13 having a surface structure which has holes with a reversed shape of the hemisphere shape having a pitch of 38 μm and a depth of 19 μm arranged in a two dimension; a polycarbonate film mold 14 having a surface structure which has holes with a reversed shape of the hemisphere shape having a pitch of 48 μm and a depth of 24 μm arranged in a two dimension; and a polycarbonate film mold 15 having a surface structure which has holes with a reversed shape of the hemisphere shape having a pitch of 140 μm and a depth of 70 μm arranged in a two dimension.

<<Preparation of Light Transmissive Base Materials 701 to 708>>

<Formation of a Hard Coat Layer (H1) on a Light Transmissive Resin Substrate (Resin Substrate B)>

Formation of a hard coat layer (H1) on a light transmissive resin substrate (resin substrate B) was done in the same manner as done for the above-described light transmissive base material 101.

<Formation of a Hard Coat Layer (H2) on a Light Transmissive Resin Substrate (Resin Substrate B)>

Another surface of the resin substrate B which has been formed with the hard coat layer (H1) was coated with the above-described coating composition for a hard coat layer. Onto this coating layer was closely adhered each of the aforesaid polycarbonate film molds 9 to 15 to past these polycarbonate film molds together.

Subsequently, under the state of pasting together, a UV light was irradiated to cure, and then, the polycarbonate film mold was demolded. It was formed by transfer a hard coat layer (H2) having a rugged structure on the resin substrate B. Thus light transmissive base materials 701 to 707 were prepared. When observed with a scanning type electron microscope, it was found as follows: light transmissive base materials 701 had a pitch of 0.3 μm and a height of 0.15 μm of a hemisphere shape; light transmissive base materials 702 had a pitch of 4 μm and a height of 2 μm of a hemisphere shape; light transmissive base materials 703 had a pitch of 9 μm and a height of 4.5 μm of a hemisphere shape; light transmissive base materials 704 had a pitch of 10 μm and a height of 10 μm of a hemisphere shape; light transmissive base materials 705 had a pitch of 38 μm and a height of 19 μm of a hemisphere shape; light transmissive base materials 706 had a pitch of 48 μm and a height of 24 μm of the hemisphere shape; and light transmissive base materials 707 had a pitch of 140 μm and a height of 70 μm of the hemisphere shape. In all of them, the convex part occupied 78.5% of the surface area of the hard coat layer (H2).

The refractive index of the hard coat layer (H1) and that of the hard coat layer (H2) was respectively 1.85. Moreover, light transmissive base material 708 was prepared in the same manner as preparation of light transmissive base materials 701, without using a polycarbonate film mold, and another surface of the light transmissive base material (resin substrate B) which has been formed with the hard coat layer (H1) was provided with a hard coat layer (H2) prepared in the same manner as preparation of the hard coat layer (H1).

Organic EL elements 801 to 808 each were prepared in the same manner as preparation of Organic EL element 201 except that the light transmissive base material employed was replaced with the substrates 701 to 708, respectively.

Quantum efficiency of light extraction and bending resistance of the samples were evaluated in the same manner as in Example 2.

The obtained results were listed in Table 5.

TABLE 5

| Organic EL element No. | Light transmissive substrate No. | Refractive index ITO, n(A) | Refractive index Resin substrate B, n(B) | Refractive index of Hard coat layer n(H1) | n(H2) | Pitch of the convex part (μm) | Height of the convex part (μm) | Quantum Efficiency of Light Extraction | Bending resistance | Remarks |
|---|---|---|---|---|---|---|---|---|---|---|
| 801 | 701 | 1.85 | 1.75 | 1.85 | 1.85 | 0.3 | 0.15 | 100 | 6 | Invention |
| 802 | 702 | 1.85 | 1.75 | 1.85 | 1.85 | 4 | 2 | 105 | 6 | Invention |
| 803 | 703 | 1.85 | 1.75 | 1.85 | 1.85 | 9 | 4.5 | 109 | 6 | Invention |
| 804 | 704 | 1.85 | 1.75 | 1.85 | 1.85 | 20 | 10 | 120 | 6 | Invention |
| 805 | 705 | 1.85 | 1.75 | 1.85 | 1.85 | 38 | 19 | 115 | 6 | Invention |
| 806 | 706 | 1.85 | 1.75 | 1.85 | 1.85 | 48 | 24 | 118 | 6 | Invention |
| 807 | 707 | 1.85 | 1.75 | 1.85 | 1.85 | 140 | 70 | 102 | 6 | Invention |
| 808 | 708 | 1.85 | 1.75 | 1.85 | 1.85 | — | — | 85 | 6 | Comparison |

From the results shown in Table 5, it was found that organic EL elements 801 to 807 relating to the present invention were excellent both in quantum efficiency of light extraction and bending resistance compared with the comparison sample 808. In addition, two pieces of each organic electroluminescence element were superimposed so that the hard coat layer (H2) and the sealing member were contacted. After they were loaded with 300 g/cm$^2$ at 40° C. for 10 days, peeling-off test was conducted using a blocking tester. It was found that all of organic EL elements 801 to 807 concerning the present invention were excellent in anti-blocking property compared with the comparison sample 808.

What is claimed is:

1. An organic electroluminescence element comprising a transparent electrode, a light emitting layer and a counter electrode, sequentially laminated on a light transmissive base material,
   wherein the light transmissive base material comprises a light transmissive resin substrate (resin substrate B) provided with a first hard coat layer (H1) in contact with a first surface of the light transmissive resin substrate and a second hard coat (H2) in contact with a second surface of the light transmissive resin substrate opposing the first surface;
   wherein the first and second hard coat layers comprise metal oxide nano particles;
   wherein the transparent electrode is formed on the first hard coat layer (H1); and
   wherein a rugged structure is formed on the second hard coat layer (H2).

2. The organic electroluminescence element of claim 1, wherein refractive indexes of the light transmissive base material (resin substrate B), the first hard coat layer (H1), the second hard coat layer (H2) and the transparent electrode each satisfy the following expressions (1) to (4), $$-0.2 < n(H1)-n(A) < 0.2 \qquad \text{Expression (1)}$$

$$-0.1 < n(H1)-n(B) < 0.1 \qquad \text{Expression (2)}$$

$$-0.1 < n(H2)-n(B) < 0.1 \qquad \text{Expression (3)}$$

$$-0.1 < n(H1)-n(H2) < 0.1, \qquad \text{Expression (4)}$$

provided that, n(A): a refractive index of the transparent electrode,
n(H1): a refractive index of the first hard coat layer (H1),
n(H2): a refractive index of the second hard coat layer (H2),
n(B): a refractive index of the light transmissive resin substrate (resin substrate B).

3. The organic electroluminescence element of claim 1, wherein at least one of the refractive indexes of the first hard coat layer and the second hard coat layer, and the refractive index of the light transmissive resin substrate are 1.65 to 2.00.

4. The organic electroluminescence element of claim 1, wherein the metal oxide nano particles are made of zirconium oxide or titanium oxide.

5. The organic electroluminescence element of claim 1, wherein the rugged structure occupies 90% or more of a total surface of the second hard coat layer (H2).

6. The organic electroluminescence element of claim 1, wherein the rugged structure has an average height of 1 to 50 μm.

7. The organic electroluminescence element of claim 1, wherein the rugged structure has an average pitch of 1 to 50 μm.

8. The organic electroluminescence element of claim 1, wherein the metal oxide nano particles have an average particle size of 1 nm to 100 nm.

9. A lighting device comprising the organic electroluminescence element of claim 1.

10. A method of producing an organic electroluminescence element comprising a transparent electrode, a light emitting layer, and a counter electrode in this order, laminated on a light transmissive resin substrate wherein the light transmissive base material comprises a light transmissive resin substrate (resin substrate B) provided with a first hard coat layer (H1) in contact with a first surface of the light transmissive resin substrate and a second hard coat layer (H2) in contact with a second surface of the light transmissive resin substrate opposing the first surface, the first and second hard coat layers comprise metal oxide nano particles, the transparent electrode is formed on the first hard coat layer (H1), a rugged structure is formed on the second hard coat layer (H2), and
wherein the method comprises the following steps (1) to (4) for forming the rugged structure provided on the second hard coat layer (H2):
(1) filling up or coating a mold having a rugged structure with a composition containing a curable resin;
(2) pasting the composition containing the curable resin which is filled up or coated on the mold having a rugged structure together with the resin substrate B;
(3) curing the composition containing the curable resin which is pasted together with the resin substrate B; and
(4) demolding the resin substrate B from the mold in a condition that the aforesaid composition containing the curable resin pasted together with the aforesaid resin substrate B has been cured.

11. A method of producing an organic electroluminescence element comprising a transparent electrode, a light emitting layer and a counter electrode in this order, laminated on a light transmissive base material, wherein the light transmissive base material includes a light transmissive resin substrate (resin substrate B) provided with a first hard coat layer (H1) on a first surface of the light transmissive resin substrate that opposes the first surface, the first and second hard coat layers comprise metal oxide nano particles, the transparent electrode is formed on the first hard coat layer (H1), and a rugged structure is formed on the second hard coat layer (H2),
wherein the method comprises the following steps (5) to (8) for forming the rugged structure provided on the second hard coat layer (H2):
(5) forming a composition layer containing a curable resin on a surface of the resin substrate B;
(6) pasting a mold having a rugged structure together with the composition layer containing the curable resin formed on the surface of the resin substrate B;
(7) curing the composition layer containing the curable resin which is pasted together with the mold having the rugged structure;
(8) demolding the resin substrate B from the mold in a condition that the composition containing the curable resin pasted together with the resin substrate B has been cured.

12. The method of producing an organic electroluminescence element of claim 10,
wherein refractive indexes of the light transmissive base material (resin substrate B), the first hard coat layer (H1), the second hard coat layer (H2) and the transparent electrode each satisfy the following expressions (1) to (4), $$-0.2 < n(H1)-n(A) < 0.2 \qquad \text{Expression (1)}$$

$$-0.1 < n(H1)-n(B) < 0.1 \qquad \text{Expression (2)}$$

$$-0.1 < n(H2)-n(B) < 0.1 \qquad \text{Expression (3)}$$

$$-0.1 < n(H1)-n(H2) < 0.1, \qquad \text{Expression (4)}$$

provided that, n(A): a refractive index of the transparent electrode,
n(H1): a refractive index of the first hard coat layer (H1),
n(H2): a refractive index of the second hard coat layer (H2),
n(B): a refractive index of the light transmissive resin substrate (resin substrate B).

13. The method of producing an organic electroluminescence element of claim 11,
wherein refractive indexes of the light transmissive base material (resin substrate B), the first hard coat layer (H1), the second hard coat layer (H2) and the transparent electrode each satisfy the following expressions (1) to (4), $$-0.2 < n(H1)-n(A) < 0.2 \qquad \text{Expression (1)}$$

$$-0.1 < n(H1)-n(B) < 0.1 \qquad \text{Expression (2)}$$

$$-0.1 < n(H2)-n(B) < 0.1 \qquad \text{Expression (3)}$$

$$-0.1 < n(H1)-n(H2) < 0.1, \qquad \text{Expression (4)}$$

provided that, n(A): a refractive index of the transparent electrode,
n(H1): a refractive index of the first hard coat layer (H1),
n(H2): a refractive index of the second hard coat layer (H2),
n(B): a refractive index of the light transmissive resin substrate (resin substrate B).

* * * * *